(12) United States Patent
Maeng et al.

(10) Patent No.: US 11,171,420 B2
(45) Date of Patent: Nov. 9, 2021

(54) ANTENNA MODULE

(71) Applicant: AMOTECH CO., LTD., Incheon (KR)

(72) Inventors: Joo-Seung Maeng, Incheon (KR); Jin-Won Noh, Suwon-si (KR); Eui-Jin Jung, Incheon (KR); Kil-Jae Jang, Seongnam-si (KR)

(73) Assignee: AMOTECH CO., LTD., Incheon (KR)

( * ) Notice: Subject to any disclaimer, the term of this patent is extended or adjusted under 35 U.S.C. 154(b) by 237 days.

(21) Appl. No.: 16/469,050

(22) PCT Filed: Nov. 16, 2017

(86) PCT No.: PCT/KR2017/013016
§ 371 (c)(1),
(2) Date: Jun. 12, 2019

(87) PCT Pub. No.: WO2018/117431
PCT Pub. Date: Jun. 28, 2018

(65) Prior Publication Data
US 2020/0127377 A1 Apr. 23, 2020

(30) Foreign Application Priority Data

Dec. 20, 2016 (KR) .................. 10-2016-0174983
Jun. 30, 2017 (KR) .................. 10-2017-0083819

(51) Int. Cl.
*H01Q 7/06* (2006.01)
*H01Q 1/22* (2006.01)
(Continued)

(52) U.S. Cl.
CPC ............. *H01Q 7/06* (2013.01); *G06K 19/077* (2013.01); *H01Q 1/2216* (2013.01);
(Continued)

(58) Field of Classification Search
CPC .............................. H01Q 7/06; H04B 5/0081
See application file for complete search history.

(56) References Cited

U.S. PATENT DOCUMENTS

2012/0208606 A1    8/2012  Kubo et al.
2016/0197402 A1*   7/2016  Lee .................. H04B 5/0081
                                                343/702
(Continued)

FOREIGN PATENT DOCUMENTS

CN      102687338 A      9/2012
KR      20100049259 A    5/2010
(Continued)

OTHER PUBLICATIONS

English Translation of KR10-2016-0078847A.

*Primary Examiner* — Daniel Munoz
(74) *Attorney, Agent, or Firm* — CL Intellectual LLC

(57) ABSTRACT

Provided is an antenna module which can minimize the resistance of a radiation pattern by forming the radiation pattern on both surfaces or on a single surface in accordance with a relative position to an insertion hole in which a magnetic sheet is inserted and whether to overlap the magnetic sheet. The provided antenna module includes a radiation pattern is formed on both surfaces of the flexible sheet at a part of regions and is formed on a single surface of the flexible sheet at a remaining part.

8 Claims, 31 Drawing Sheets

(51) Int. Cl.
*H01Q 1/52* (2006.01)
*H04B 5/00* (2006.01)
*G06K 19/077* (2006.01)

(52) U.S. Cl.
CPC .......... *H01Q 1/521* (2013.01); *H04B 5/0031* (2013.01); *H04B 5/0081* (2013.01)

(56) References Cited

U.S. PATENT DOCUMENTS

| | | | |
|---|---|---|---|
| 2017/0005399 A1 | 1/2017 | Ito et al. | |
| 2018/0069294 A1* | 3/2018 | Kang | H01Q 1/2291 |
| 2018/0198209 A1* | 7/2018 | Kang | H04B 5/0056 |
| 2018/0277954 A1* | 9/2018 | Lee | H01Q 7/00 |

FOREIGN PATENT DOCUMENTS

| | | |
|---|---|---|
| KR | 20140113206 A | 9/2014 |
| KR | 20150145960 A | 12/2015 |
| KR | 10-2016-0078847 A | 7/2016 |
| KR | 20160128862 A | 11/2016 |
| KR | 20160129927 A | 11/2016 |
| WO | 2015147133 A1 | 10/2015 |

\* cited by examiner

| Type | Remarks | L (μH) | DCR (Ω) | MST Test Result | |
|---|---|---|---|---|---|
| | | | | Z-Y @ X=0 (135 Points or more) | X-Y @ 2cm (55% or more) |
| Antenna Module in Related Art | 43.5mm X 60mm X 0.2T | 12.5 μH | 1.2 Ω | 115 | 47.06% |
| Antenna Module of Present Disclosure | 42.6mm X 59.8mm X 0.2T | 16.6 μH | 1.0 Ω | 188 | 85.62% |

FIG. 10

| Section | Distance | | | | | | Load Modulation(mV) | | | |
|---|---|---|---|---|---|---|---|---|---|---|
| | Tag Mode (mm) | Reader Mode(mm) | | | | | | | | |
| | ACR(30) | ULC (Min.10) | Topaz (Min.20) | Ultra light (Min.20) | EV1 (Min.20) | MN910 (Min.20) | TecTiles (Min.20) | 0,0,0 (8.8mV) | 1,0,0 (7.2mV) | 2,0,0 (5.6mV) | 3,0,0 (4.0mV) |
| Antenna Module in Related Art | 55 | 15 | 31 | 34 | 19 | 22 | 15 | 24.51 | 16.57 | 10.95 | 6.51 |
| Antenna Module of Present Disclosure | 58 | 16 | 30 | 33 | 21 | 22 | 17 | 33.02 | 21.48 | 15.24 | 12.94 |

FIG. 11

| Section | Measurement side | Z-Y Plane @ X=0 | X-Y Plane @ Z=2cm |
|---|---|---|---|
| Rear cover on which first slit and second slit are formed (Antenna module of FIG. 2) | Front side | 141 Points | 57.52% |
| | Rear side | 149 Points | 62.75% |
| Rear cover on which first to third slits are formed (Antenna module of FIG. 12) | Front side | 147 Points | 62.09% |
| | Rear side | 127 Points | 48.37% |

FIG.31

| Second Radiation Pattern (NFC) | Recognition Distance | | | | | | | Load Modulation (mV) | | | |
|---|---|---|---|---|---|---|---|---|---|---|---|
| | Tag Mode (mm) | Reader Mode (mm) | | | | | | | | | |
| | ACR(30) | ULC (Min.10) | Topaz (Min.20) | Ultra light (Min.30) | EV1 (Min.15) | MN910 (Min.20) | TecTiles (Min.15) | Athelia (Min.5) | 0,0,0 (8.8mV) | 1,0,0 (7.2mV) | 2,0,0 (5.6mV) | 3,0,0 (4.0mV) |
| Rear cover on which first slit and second slit are formed (Antenna module of FIG. 2) | 42 | 15 | 29 | 35 | 20 | 21 | 16 | 8 | 38.06 | 22.03 | 14.54 | 10.02 |
| Rear cover on which first to third slits are formed (Antenna module of FIG. 12) | 80 | 33 | 53 | 53 | 39 | 30 | 26 | 15 | 97.45 | 53.07 | 36.33 | 25.22 |

FIG. 32

ANTENNA MODULE

CROSS-REFERENCE TO RELATED APPLICATIONS

This application is a National Stage of International patent application PCT/KR2017/013016, filed on Nov. 16, 2017, which claims priority to foreign Korean patent application No. 10-2016-0174983 filed Dec. 20, 2016, and Korean patent application No. KR 10-2017-0083819 filed on Jun. 30, 2017, the disclosures of which are incorporated by reference in their entireties.

FIELD OF THE INVENTION

The present disclosure relates to an antenna module, and more particularly, to an antenna module which is built in a portable terminal to perform electronic payment and near field communication.

BACKGROUND

With the development of technology, portable terminals, such as cellular phone, PDA, PMP, navigation, and laptop, additionally provide functions of DMB, wireless Internet, and device-to-device near field communication in addition to basic functions of call, moving image/music reproduction, and road guide. Accordingly, a portable terminal is provided with a plurality of antennas for wireless communications, such as wireless Internet and Bluetooth.

Recently, there is a trend to apply functions of information exchange between terminals, payment, ticket reservation, and retrieval to a portable terminal using near field communication (NFC). For this, a portable terminal is mounted with an antenna module (i.e., NFC antenna module) that is used for a near field communication system. In this case, the NFC antenna module being used is a non-contact type near field communication (NFC) module that uses a frequency band of about 13.56 MHz as one of electronic tags (RFID tags), and it transmits data between terminals in a short distance of about 10 cm. The NFC is widely used in the fields of not only payment but also commodity information at a supermarket or a general store, transmission of travel information for visitors, traffics, and access control locking devices.

Recently, to meet the demand for electronic payment related functions using a portable terminal, such as Samsung Pay™ or Apple Pay™, an antenna for an electronic payment has been mounted on a portable terminal. As an example, Samsung Pay is to perform an electronic payment using a magnetic secure transmission system, and thus a magnetic secure transmission (MST) antenna is mounted on a portable terminal that supports Samsung Pay.

On the other hand, as miniaturization and thinning of portable terminals are demanded in portable terminal markets, there is a trend to reduce the mounting space for internal components through reduction of the size and thickness of the portable terminals.

To meet the market demand as described above, various types of antenna modules have been developed to minimize the area and thickness of the portable terminals.

However, the MST antenna module used for the electronic payment is in the form of coil windings, and thus in the case of miniaturization and thinning of the MST antenna module, the inferiority rate is increased in manufacturing the antenna module due to various causes, such as coil short occurrence, irregular windings caused by vending, and distortion caused by thin materials, and the performance of the antenna module is deteriorated.

Further, with the miniaturization of the portable terminal, the mounting space for simultaneously mounting a plurality of antennas becomes insufficient. Accordingly, in the market, there has been a need for an integrated antenna in which an NFC antenna and an MST antenna are integrally formed.

SUMMARY OF THE INVENTION

The present disclosure has been made in order to solve the above-described problems, and an aspect of the present disclosure is to provide an antenna module which can implement the performance that is equal to or higher than the performance of an antenna module in the related art with simplification of a manufacturing process through insertion of a part of a magnetic sheet into a flexible printed circuit board on which a radiation pattern for electronic payment and a radiation pattern for near field communication are formed.

Another aspect of the present disclosure is to provide an antenna module which can minimize the resistance of a radiation pattern by forming the radiation pattern on both sides or on a single side in accordance with a relative position to an insertion hole in which a magnetic sheet is inserted and whether to overlap the magnetic sheet.

Still another aspect of the present disclosure is to provide an antenna module which can implement the performance that is equal to or higher than the performance of an antenna module in the related art with minimization of an influence exerted on a geomagnetic sensor through flake processing of a part of a magnetic sheet disposed adjacent to the geomagnetic sensor.

In accordance with an aspect of the present disclosure, an antenna module includes an antenna sheet on which a slit and a radiation pattern are formed; and a magnetic sheet configured to be inserted into and to penetrate the slit, wherein a part of the magnetic sheet is disposed on a front side of the antenna sheet to overlap the radiation pattern, and a remaining part of the magnetic sheet is disposed on a rear side of the antenna sheet to overlap the radiation pattern.

The magnetic sheet may include a shield portion disposed on the rear side of the antenna sheet; and a core portion extending from one side of the shield portion and disposed on the front side of the antenna sheet to penetrate the slit of the antenna sheet. The shield portion may overlap a radiation pattern for near field communication formed on the antenna sheet, and the core portion may overlap a radiation pattern for electronic payment of the antenna sheet.

In accordance with another aspect of the present disclosure, an antenna module includes a flexible sheet; a radiation pattern formed on the flexible sheet; and a magnetic sheet disposed on a front side and a rear side of the flexible sheet, wherein the flexible sheet is partitioned into a plurality of regions, and the radiation pattern is formed on a front side and a rear side of a part of the plurality of regions and the radiation pattern is formed on one of a front side and a rear side of a remaining part of the plurality of regions.

According to the antenna module according to the present disclosure, since a part of the magnetic sheet is inserted into the flexible printed circuit board on which the radiation pattern for electronic payment and the radiation pattern for near field communication are formed, the mounting space is secured, the manufacturing and mounting process is simplified, and the performance that is equal to or higher than the performance of the antenna module in the related art can be implemented.

Further, according to the antenna module, since the radiation pattern for the near field communication and the radiation pattern for the electronic payment are formed on the flexible printed circuit board and then they are coupled to the magnetic sheet, regions for recognizing the near field communication and the electronic payment are enlarged as compared with the antenna module in the related art.

Further, according to the antenna module, since the antenna is configured using the flexible member, it can be prevented from being damaged during its mounting, and it can be easily mounted even on an uneven position.

Further, according to the antenna module, since a part of the magnetic sheet is inserted into or is coupled to the flexible printed circuit board on which the radiation pattern for the electronic payment and the radiation pattern for the near field communication are formed, the manufacturing process can be simplified as compared with the antenna module in the related art in which a coil is wound on a magnetic material.

That is, according to the antenna module, since a coil winding process including coil winding, coil insertion, coil compression, soldering, cutting, UV bonding, UV curing, and coil terminal connection can be omitted in the process of manufacturing an antenna module in the related art in which a coil is wound, the manufacturing process can be simplified.

Further, according to the antenna module, since a part of the magnetic sheet is inserted into or is coupled to the flexible printed circuit board on which the radiation pattern for the electronic payment and the radiation pattern for the near field communication are formed, it is not necessary to attach an insulating material for preventing a short between a magnetic material and a coil, and thus the manufacturing process can be simplified with the manufacturing cost saved.

Further, according to the antenna module, since a projection region that is disposed adjacent to a slot formed on a rear cover of a portable terminal is formed on a magnetic sheet, a magnetic field emitted out of the portable terminal is increased to form a strong radiation field, and thus the antenna performance can be improved.

Further, according to the antenna module, since a projection region that is disposed adjacent to a slot formed on a rear cover of a portable terminal is formed on a magnetic sheet, a radiation field is formed on the front and rear sides of the portable terminal, and thus near field communication becomes possible on the front and rear sides of the portable terminal.

Further, according to the antenna module, since a step height compensation sheet is disposed on the magnetic sheet, the step height between the magnetic sheet and the antenna sheet can be compensated for, and thus the antenna module with a constant thickness is formed and is easily mounted on the portable terminal.

Further, according to the antenna module, since holes are formed on a step height compensation sheet, bubble generation is minimized during attachment of a protection sheet, and evenness of the antenna module surface can be improved.

Further, according to the antenna module, since a step height compensation sheet is disposed after a partial region of the magnetic sheet that overlaps a geomagnetic sensor of the portable terminal is removed, interference of the geomagnetic sensor caused by the antenna module is prevented from occurring, and thus the sensing performance of the geomagnetic sensor can be prevented from being deteriorated.

Further, according to the antenna module, since a support member is disposed on a front side of the antenna module to support a circuit board of the portable terminal, the antenna performance can be prevented from being deteriorated, and the circuit board can be firmly supported.

Further, according to the antenna module, since a dummy region is formed on an antenna sheet through removal of a part of a shielding sheet in the case where a slit is formed in a vertical direction on the portable terminal, the performance of a main antenna and the antenna module of the portable terminal can be prevented from being deteriorated.

Further, according to the antenna module, since flake processing of a part of the magnetic sheet disposed adjacent to the geomagnetic sensor is performed, it is possible to implement the performance that is equal to or higher than the performance of the antenna module in the related art with minimization of an influence exerted on the geomagnetic sensor.

BRIEF DESCRIPTION OF THE DRAWINGS

FIGS. 8 to 11 are views explaining the antenna characteristics of an antenna module according to a first embodiment of the present disclosure;

FIGS. 31 and 32 are views explaining the antenna characteristics of an antenna module according to a third embodiment of the present disclosure.

DETAILED DESCRIPTION

Figure 1:
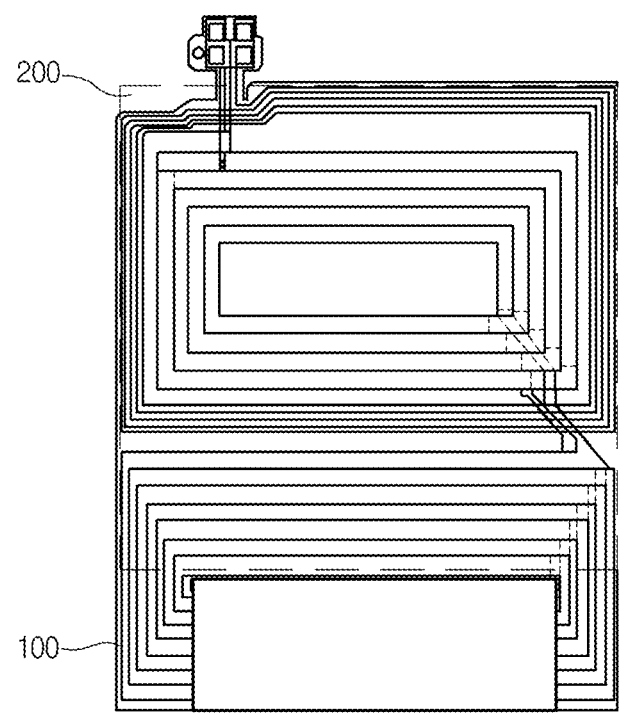
FIG. 1 is a view explaining an antenna module according to a first embodiment of the present disclosure.

Hereinafter, preferred embodiments of the present disclosure will be described in detail with reference to the accompanying drawings so that those of ordinary skill in the art can easily embody the technical idea of the present disclosure. In giving drawing reference numerals to constituent elements in the drawings, it is to be noted that the same drawing reference numerals are used for the same constituent elements, even in different drawings. In describing the present disclosure, well-known related configurations or functions are not described in detail since they would obscure the subject matter of the present disclosure.

Referring to FIG. 1, an antenna module according to a first embodiment of the present disclosure is configured to include an antenna sheet 100 and a magnetic sheet 200. It is exemplified that the antenna module is mounted on a battery pack of a portable terminal or on a rear cover.

On the antenna sheet 100, radiation patterns for near field communication and electronic payment are formed. The radiation patterns are formed on at least one of a front side and a rear side of the antenna sheet 100.

The antenna sheet includes a flexible sheet 110, a radiation pattern 120 for near field communication, and a radiation pattern 130 for electronic payment.

It is exemplified that the flexible sheet 110 is a flexible board on which a slit 111 is formed.

The radiation pattern 120 for the near field communication is formed on at least one of a front side and a rear side of the flexible sheet 110.

The radiation pattern 130 for the electronic payment is formed on at least one of a front side and a rear side of the flexible sheet 110. It is exemplified that the radiation pattern 130 for the electronic payment is a radiation pattern for electronic payment.

Figure 2:
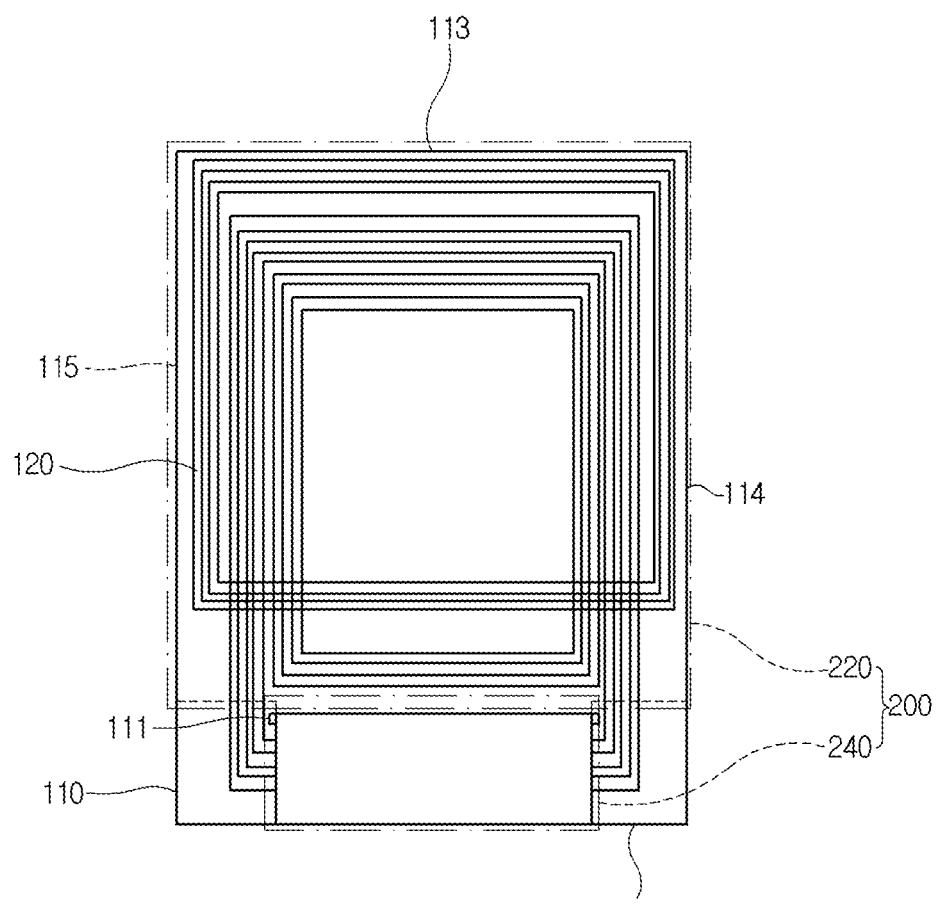
FIGS. 2 to 7 are views explaining an antenna sheet of FIG. 1.

As an example, referring to FIG. 2, the antenna sheet 100 includes a flexible sheet 110, a radiation pattern 120 for near field communication, and a radiation pattern 130 for electronic payment.

The flexible sheet 110 is in the form of a rectangle and includes a first short side 112, a second short side 113 opposite to the first short side 112, a first long side 114, and a second long side 115 opposite to the first long side 114.

The slit 111 is formed on the flexible sheet 110. The slit 111 is formed to penetrate the flexible sheet 110. The slit 111 is formed adjacent to the first short side 112 of the flexible sheet 110.

The radiation pattern 120 for the near field communication is formed on at least one of a front side and a rear side of the flexible sheet 110. The radiation patter 120 for the near field communication is formed between the slit 111 and the second short side 113. The radiation pattern 120 for the near field communication is formed adjacent to the second short side of the flexible sheet 110. The radiation pattern 120 for the near field communication is disposed spaced apart from the slit 111. The radiation pattern 120 for the near field communication may be in the form of a loop, such as a rectangle or an ellipse.

The radiation pattern 130 for the electronic payment is formed on at least one of the front side and the rear side of the flexible sheet 110. The radiation pattern 130 for the electronic payment is in the form of a loop that is alternately wound on a region between the outer periphery of the radiation pattern 120 for the near field communication and the first short side 112 and the inner periphery of the radiation pattern 120 for the near field communication.

The radiation pattern 130 for the electronic payment is formed to be wound on the outer periphery of the flexible sheet 110 (i.e., the first short side 112, the second short side 113, the first long side 114, and the second long side 115). One part of the radiation pattern 130 for the electronic payment is formed adjacent to the second short side 113 of the flexible sheet 110. The other part of the radiation pattern 130 for the electronic payment is formed adjacent to the inner periphery of the radiation pattern 120 for the near field communication. The slit 111 is interposed between the patterns adjacent to the first short side 112 of the flexible sheet 110. The radiation pattern 130 for the electronic payment may partially overlap the radiation pattern 120 for the near field communication.

That is, the radiation pattern 130 for the electronic payment is formed so that the slit 111 is disposed between the patterns wound adjacent to the first short side 112. The radiation pattern 130 for the electronic payment is formed so that the patterns formed adjacent to the first long side 114 and the second long side 115 partially overlap the radiation pattern 120 for the near field communication.

Figure 3:
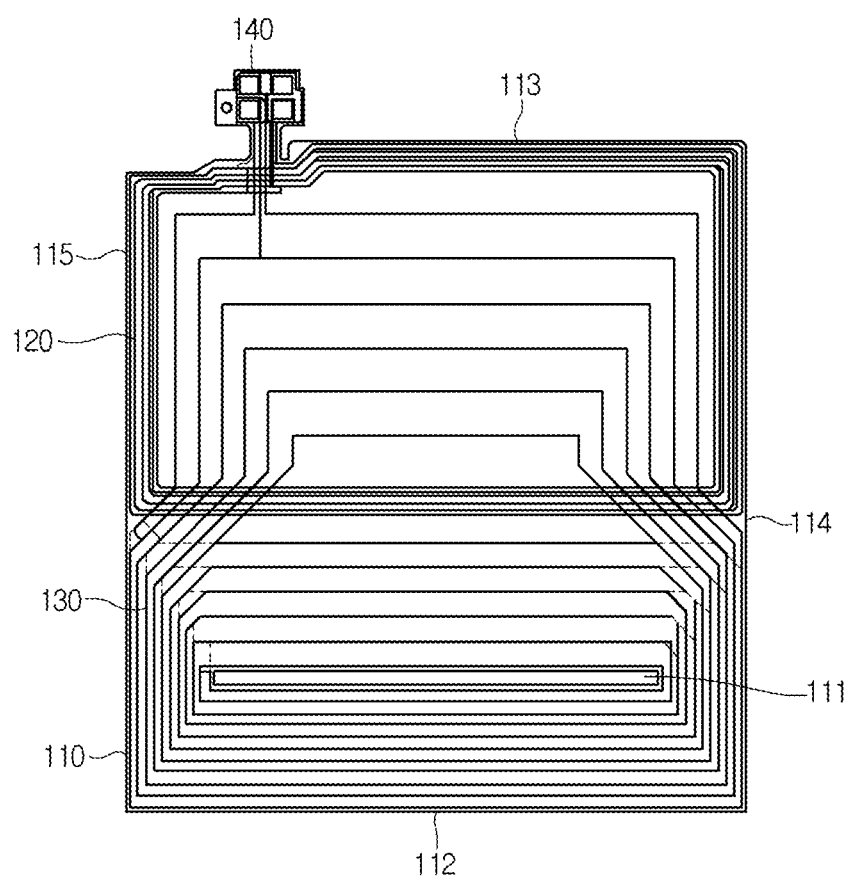

Referring to FIG. 3, the radiation pattern 130 for the electronic payment is formed so that part of the patterns wound between the slit 111 and the second short side 113 is located on the inner periphery of the radiation pattern 120 for the near field communication.

The radiation pattern 130 for the electronic payment is formed so that a pattern spacing between the slit 111 and the first short side 112 is different from a pattern spacing between the slit 111 and the second short side 113. The spacing of patterns disposed between the slit 111 and the first short side 112 is set to be wider than the spacing of patterns disposed between the slit 111 and the second short side 113.

On the other hand, both ends of the radiation pattern 120 for the near field communication and the radiation pattern 130 for the electronic payment are connected to a terminal portion 140 formed on the second short side 113 of the flexible sheet 110. Both ends of the radiation pattern 120 for the near field communication and both ends of the radiation pattern 130 for the electronic payment are connected to different terminals. Here, although FIG. 3 illustrates that the terminal portion 140 is formed to extend from the second short side 113 in an outward direction, the terminal portion 140 may also be formed in a different shape and in a different position in accordance with a connection structure with a main board of the portable terminal.

Figure 4:
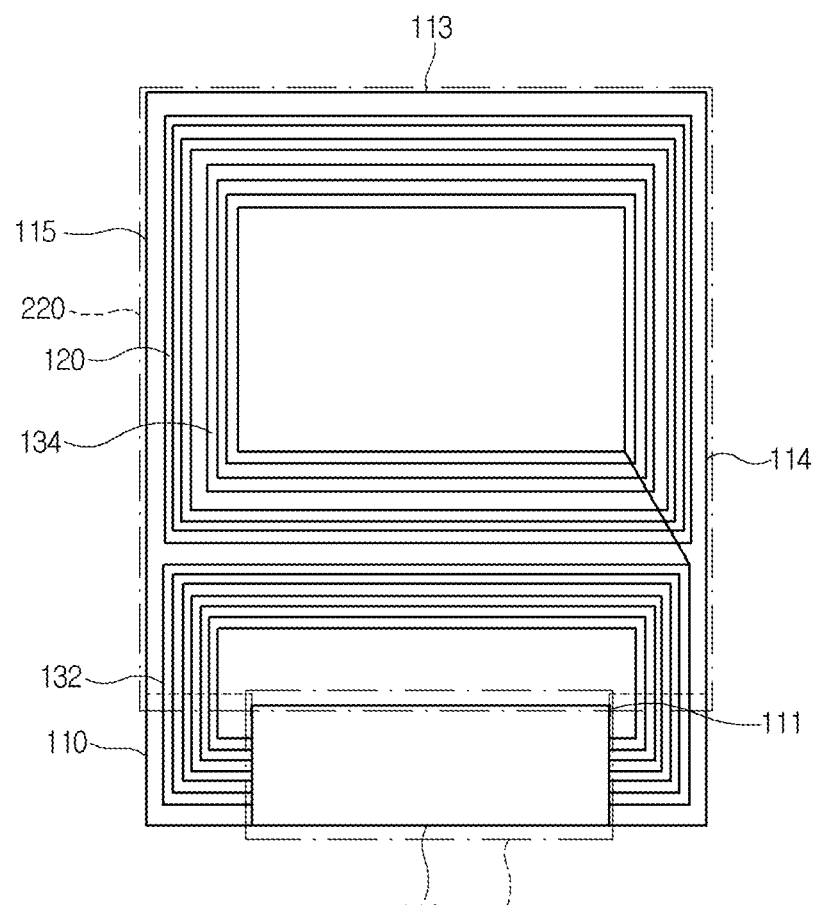
Figure 5:
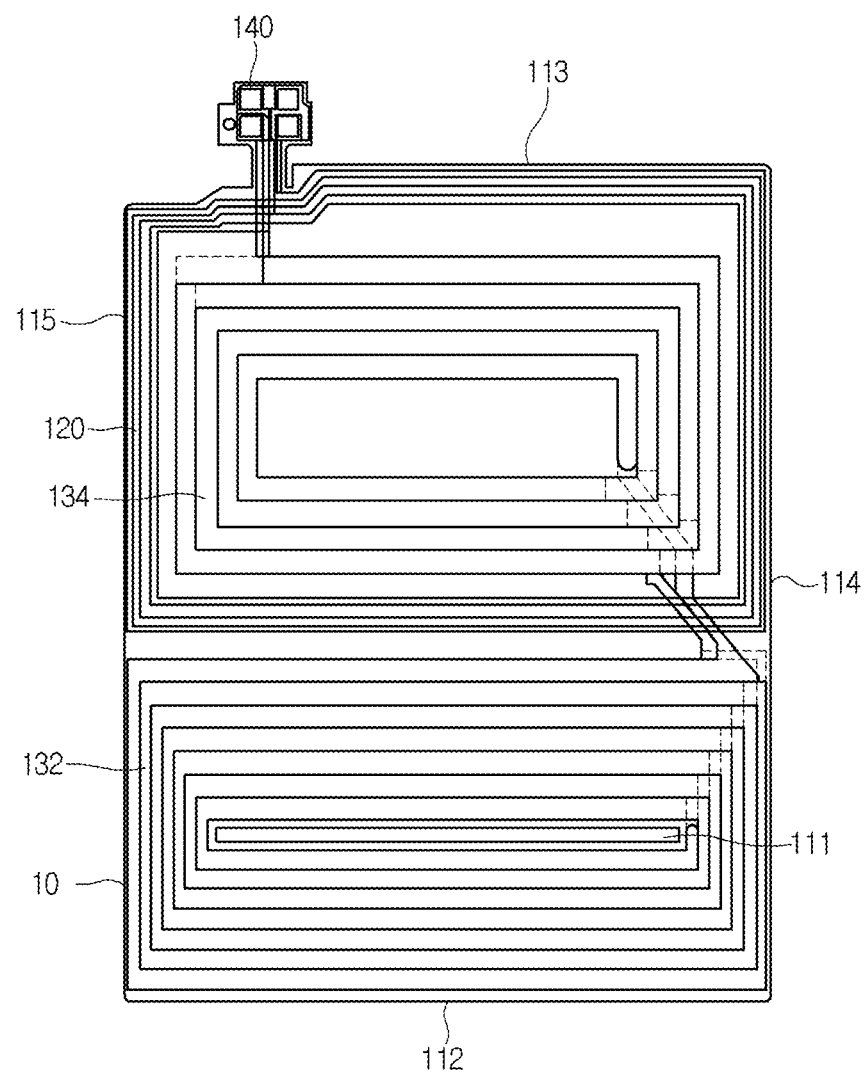

As another example, referring to FIGS. 4 and 5, an antenna sheet 100 may be configured to include a flexible sheet 110, a radiation pattern 120 for near field communication, and a radiation pattern 130 for electronic payment.

The flexible sheet 110 is in the form of a rectangle and includes a first short side 112, a second short side 113 opposite to the first short side 112, a first long side 114, and a second long side 115 opposite to the first long side 114.

A slit 111 is formed on the flexible sheet 110. The slit 111 is formed to penetrate the flexible sheet 110. The slit 111 is formed adjacent to the first short side 112 of the flexible sheet 110.

The radiation pattern 120 for the near field communication is formed on at least one of a front side and a rear side of the flexible sheet 110. The radiation patter 120 for the near field communication is formed between the slit 111 and the second short side 113. The radiation pattern 120 for the near field communication is formed adjacent to the second short side 113 of the flexible sheet 110. The radiation pattern 120 for the near field communication is disposed spaced apart from the slit 111. The radiation pattern 120 for the near field communication may be in the form of a loop, such as a rectangle or an ellipse.

The radiation pattern 130 for the electronic payment is formed on at least one of the front side and the rear side of the flexible sheet 110. The radiation pattern 130 for the electronic payment may include a first radiation pattern 132 for electronic payment and a second radiation pattern 134 for electronic payment.

The first radiation pattern 132 for the electronic payment is formed on at least one of the front side and the rear side of the flexible sheet 110. The first radiation pattern 132 for the electronic payment is formed adjacent to the first short side 112 of the flexible sheet 110. The first radiation pattern 132 for the electronic payment is formed between the first short side 112 and an outer periphery of the radiation pattern 120 for the near field communication. The first radiation pattern 132 for the electronic payment is formed by winding multiple times on an outer periphery of the slit 111. The first radiation pattern 132 for the electronic payment may be formed in the form of a loop, such as a rectangle or an ellipse.

The second radiation pattern 134 for the electronic payment is formed on at least one of the front side and the rear side of the flexible sheet 110. The second radiation pattern 134 for the electronic payment is formed spaced apart from the first radiation pattern 132 for the electronic payment. The second radiation pattern 134 for the electronic payment is formed adjacent to the second short side 113 of the flexible sheet 110. The second radiation pattern 134 for the electronic payment is formed on an inner periphery of the radiation pattern 120 for the near field communication. An outer periphery of the second radiation pattern 134 for the electronic payment is spaced apart for a predetermined distance from an inner periphery of the radiation pattern 120 for the near field communication. The second radiation pattern 134 for the electronic payment is formed by winding multiple times on the inner periphery of the radiation pattern 120 for the near field communication. The second radiation pattern 134 for the electronic payment may be formed in the form of a loop, such as a rectangle or an ellipse.

The radiation pattern 130 for the electronic payment may further include a connection pattern 136. The connection pattern 136 is connected to one end of the first radiation pattern 132 for the electronic payment and one end of the second radiation pattern 134 for the electronic payment. The connection pattern 136 may partially overlap the radiation pattern 120 for the near field communication. The other end of the first radiation pattern 132 for the electronic payment and the other end of the second radiation pattern 134 for the electronic payment are respectively connected to a terminal portion 140.

Figure 6:
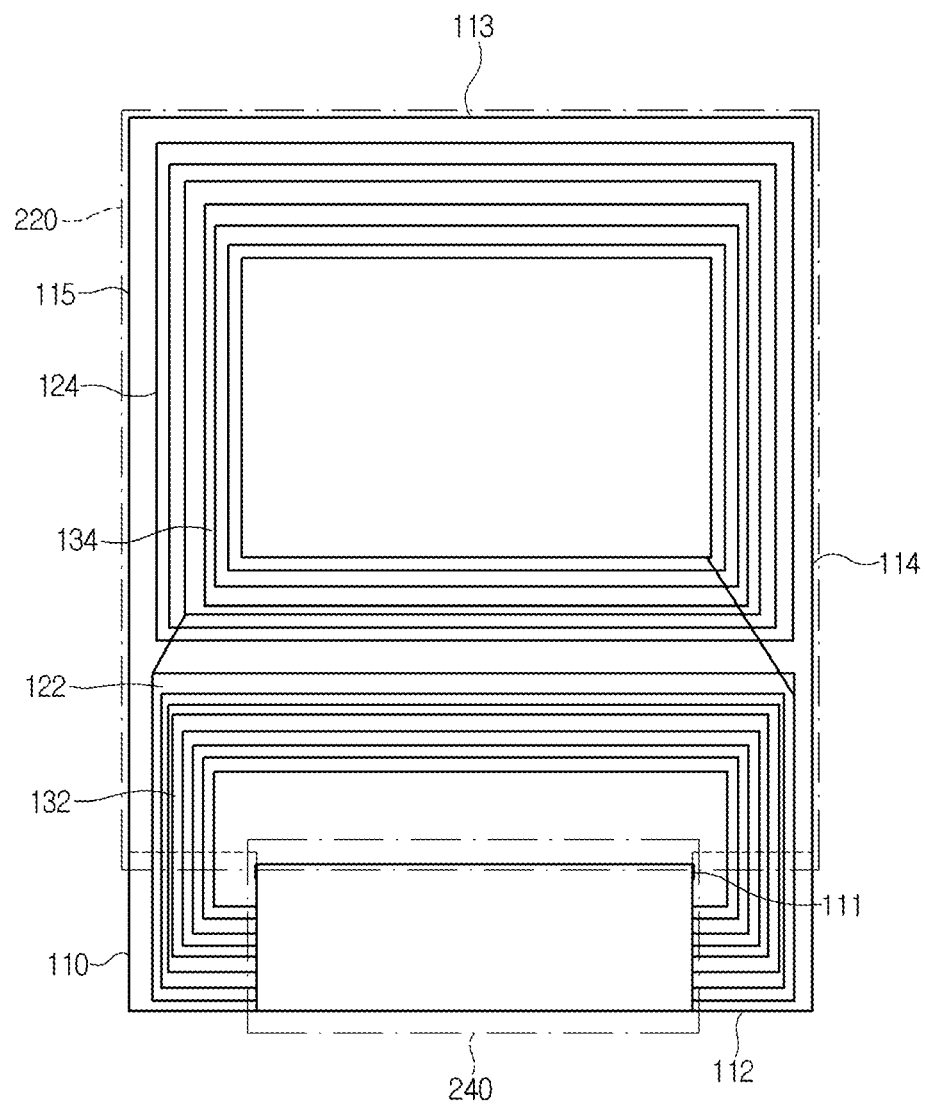
Figure 7:
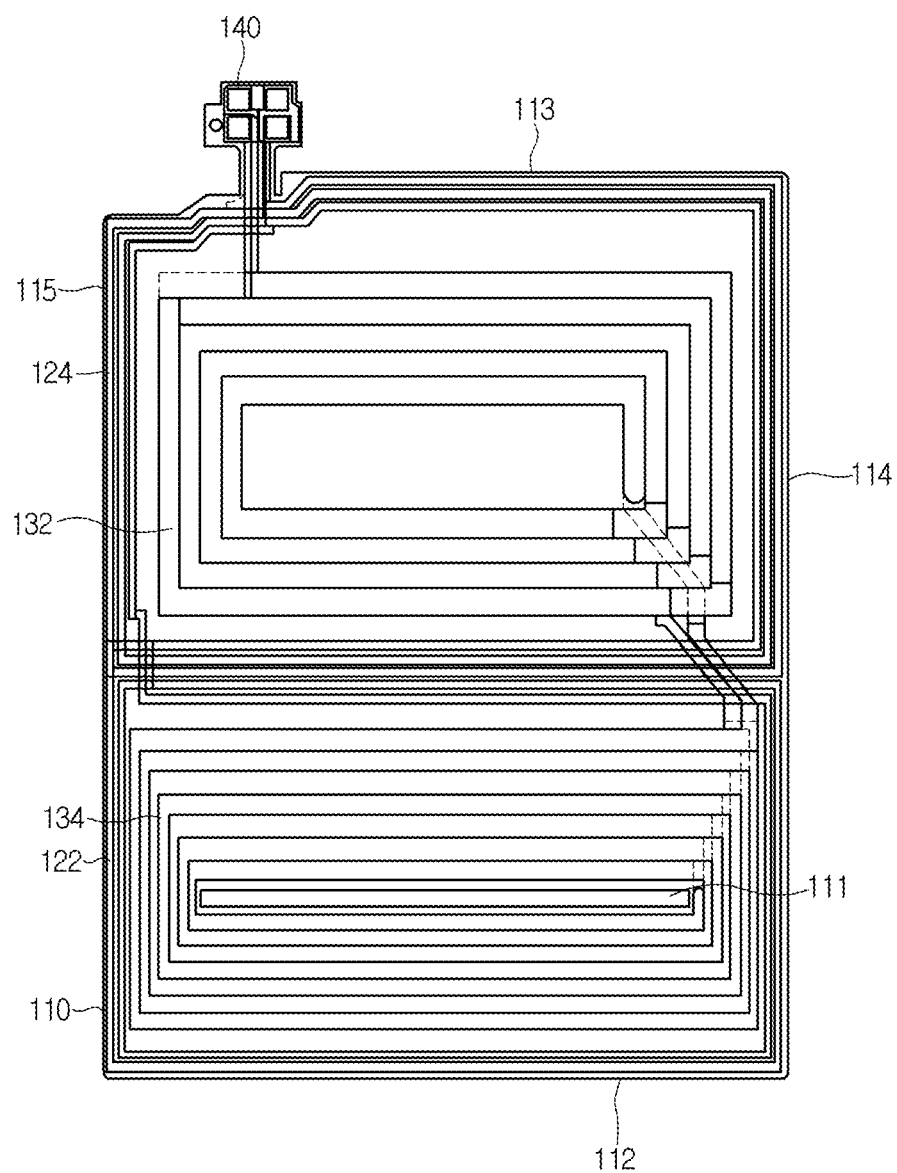

Referring to FIGS. 6 and 7, an antenna sheet 100 includes a flexible sheet 110, a radiation pattern 120 for near field communication, and a radiation pattern 130 for electronic payment.

The flexible sheet 110 is in the form of a rectangle and includes a first short side 112, a second short side 113 opposite to the first short side 112, a first long side 114, and a second long side 115 opposite to the first long side 114.

A slit 111 is formed on the flexible sheet 110. The slit 111 is formed to penetrate the flexible sheet 110. The slit 111 is formed adjacent to the first short side 112 of the flexible sheet 110.

The radiation pattern 120 for the near field communication is formed on at least one of a front side and a rear side of the flexible sheet 110. The radiation patter 120 for the near field communication includes a first radiation pattern 122 for near field communication and a second radiation pattern 124 for near field communication.

The first radiation pattern 122 for the near field communication is formed on at least one of the front side and the rear side of the flexible sheet 110. The first radiation pattern 122 for the near field communication is formed adjacent to the first short side 112 of the flexible sheet 110. The first radiation pattern 122 for the near field communication may be in the form of a loop, such as a rectangle or an ellipse.

The second radiation pattern 124 for the near field communication is formed on at least one of the front side and the rear side of the flexible sheet 110. The second radiation pattern 124 for the near field communication is formed spaced apart from the first radiation pattern 122 for the near field communication and is formed adjacent to the second short side 113 of the flexible sheet 110. The second radiation pattern 124 for the near field communication may be in the form of a loop, such as a rectangle or an ellipse.

The radiation pattern 120 for the near field communication may further include a first connection pattern 126. The first connection pattern 126 is connected to one end of the first radiation pattern 122 for the near field communication and one end of the second radiation pattern 124 for the near field communication. The other end of the first radiation pattern 122 for the near field communication and the other end of the second radiation pattern 124 for the near field communication are respectively connected to a terminal portion 140.

The radiation pattern 130 for the electronic payment is formed on at least one of the front side and the rear side of the flexible sheet 110. The radiation pattern 130 for the electronic payment may include a first radiation pattern 132 for electronic payment and a second radiation pattern 134 for electronic payment.

The first radiation pattern 132 for the electronic payment is formed on an inner periphery of the first radiation pattern 122 for the near field communication. An outer periphery of the first radiation pattern 132 for the electronic payment is spaced apart for a predetermined distance from the inner periphery of the first radiation pattern 122 for the near field communication.

The first radiation pattern 132 for the electronic payment is in the form of a loop that is wound multiple times on an outer periphery of the slit 111. The slit 111 is disposed on an inner periphery of the first radiation pattern 122 for the near field communication.

The second radiation pattern 134 for the electronic payment is formed on an inner periphery of the second radiation pattern 124 for the near field communication. An outer periphery of the second radiation pattern 134 for the electronic payment is spaced apart for a predetermined distance from the inner periphery of the second radiation pattern 124 for the near field communication.

The radiation pattern 130 for the electronic payment may further include a second connection pattern 136. The second connection pattern 136 is connected to one end of the first radiation pattern 132 for the electronic payment and one end of the second radiation pattern 134 for the electronic payment. The second connection pattern 136 may partially overlap the radiation pattern 120 for the near field communication. The other end of the first radiation pattern 132 for the electronic payment and the other end of the second radiation pattern 134 for the electronic payment are respectively connected to a terminal portion 140.

Referring to FIGS. 2, 4, and 6, one side of the magnetic sheet 200 penetrates the slit 111 formed on the antenna sheet 100, and is disposed on the front side of the antenna sheet 100. The other side of the magnetic sheet 200 is disposed on the rear side of the antenna sheet 100.

A portion of the magnetic sheet 200 disposed on the front side thereof operates as a core of the radiation pattern 130 for the electronic payment. A portion of the magnetic sheet 200 disposed on the rear thereof operates as a shielding material of the radiation pattern 120 for the near field communication. Here, it is exemplified that the magnetic sheet 200 is a nano-sized crystalline alloy ribbon sheet, an iron-based amorphous ribbon sheet, or a ferrite sheet.

The magnetic sheet 200 is in a plate shape, and includes a shield portion 220 disposed on the rear side of the antenna sheet 100, and a core portion 240 disposed on the front side of the antenna sheet 100. The shield portion 220 and the core portion 240 may be formed of the same material.

The shield portion 220 is disposed on the rear side of the antenna sheet 100. The shield portion 220 overlaps the radiation pattern 120 for the near field communication, and operates as a shielding material of the radiation pattern 120 for the near field communication. That is, the shield portion 220 blocks forming of a radiation field (magnetic field) on the rear side of the antenna sheet 100, and makes the radiation field (magnetic field) be formed only on the front side of the antenna sheet 100 (i.e., vertical direction to the radiation pattern 120 for the near field communication).

The shield portion 220 is disposed on the rear side of the antenna sheet 100 to cover the radiation pattern 120 for the near field communication. In this case, the shield portion 220 is disposed to cover the whole or at least a part of the radiation pattern 120 for the near field communication. For this, the shield portion 220 may be disposed in a position in which the shield portion 220 at least partly overlaps the radiation pattern 120 for the near field communication of the antenna sheet 100 through planar projection.

The shield portion 220 is formed to have an area that is equal to or smaller than the area of the antenna sheet 100. An outer periphery of the shield portion 220 overlaps the antenna sheet 100. Through this, the shield portion 220 is formed not to secede from the antenna sheet 100.

It is exemplified that the outer periphery of the shield portion 220 in the direction of the second short side 112 of the antenna sheet 100 and outer peripheries adjacent to the corresponding outer periphery are aligned on the outer periphery of the antenna sheet 100, and the outer periphery of the antenna sheet 100 in the direction of the first short side 112 is disposed in an inward direction on the outer periphery of the antenna sheet 100. In this case, all the outer peripheries of the shield portion may be disposed in the inward direction on the outer periphery of the antenna sheet 100.

The core portion 240 is formed to extend from one side of the shield portion 220, and is disposed on the front side of the antenna sheet 100 to penetrate the slit 111 of the antenna sheet 100. In this case, the core portion 240 operates as a core of the radiation pattern 130 for the electronic payment.

The core portion 240 is disposed on the front side of the antenna sheet 100 to cover a part of the radiation pattern 130 for the electronic payment. In this case, the core portion 240 may at least partly overlap the radiation patterns of the radiation pattern 130 for the electronic payment that are formed in the direction of the first short side 112 of the antenna sheet 100.

The core portion is formed to have an area that is equal to or smaller than the area of the antenna sheet 100. An outer periphery of the core portion 240 overlaps the antenna sheet 100. Through this, the core portion 240 is formed not to secede from the antenna sheet 100.

It is exemplified that one side of the core portion 240 that is opposite to the shield portion 220 is aligned on the first short side 112 of the antenna sheet 100. One side of the core portion 240 that is opposite to the shield portion 220 may be disposed in the inward direction of the first short side 112 of the antenna sheet 100.

An adhesive layer (not illustrated) may be formed between the antenna sheet 100 and the magnetic sheet 200. One adhesive layer may be formed between the front side of the antenna sheet 100 and the core portion 240 of the magnetic sheet 200, and another adhesive layer may be formed between the rear side of the antenna sheet 100 and the shield portion 220 of the magnetic sheet 200.

Figure 8:
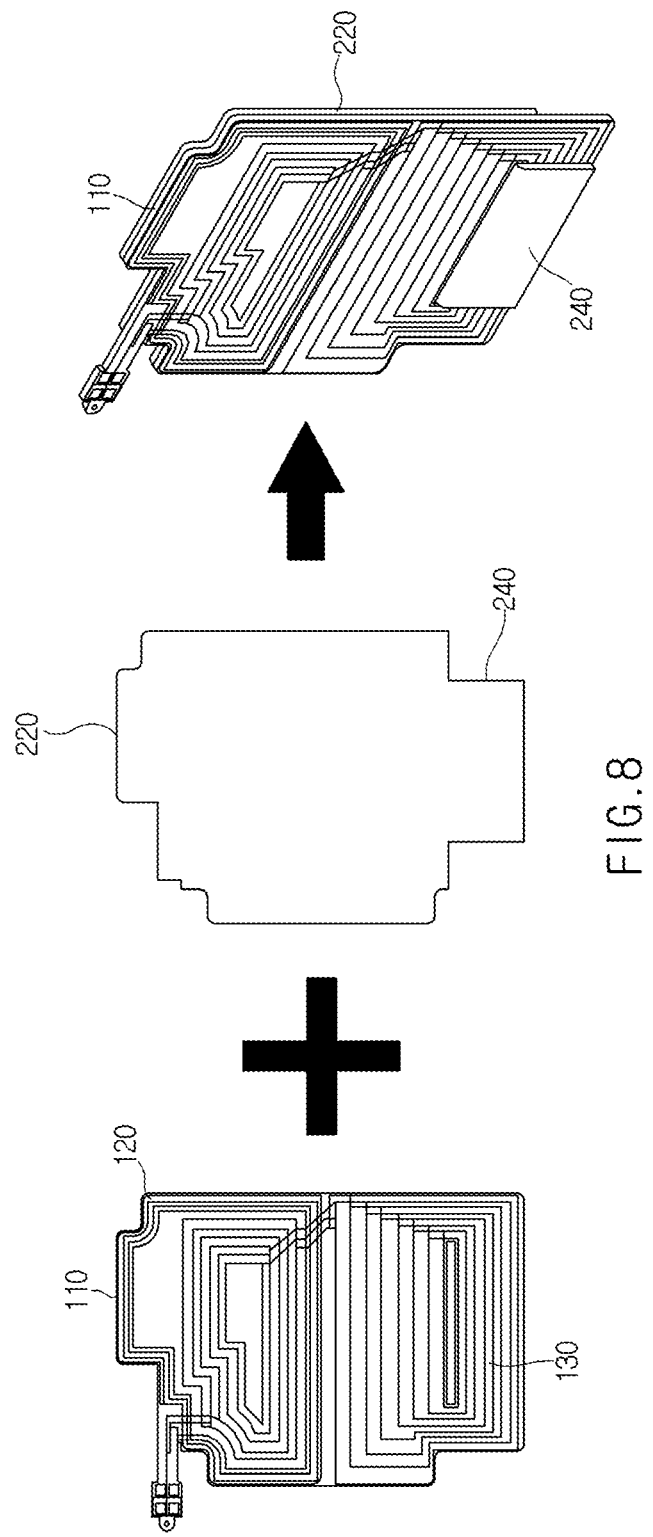

Referring to FIG. 8, an antenna module according to the first embodiment of the present disclosure is provided with a radiation pattern 120 for near field communication and a radiation pattern 130 for electronic payment that are formed on one side of a flexible sheet 110. In this case, a shield portion 220 of the magnetic sheet 200 is disposed on the rear side of the flexible sheet 110, and a core portion 240 is disposed on the front side to penetrate the flexible sheet 110.

Figure 9:
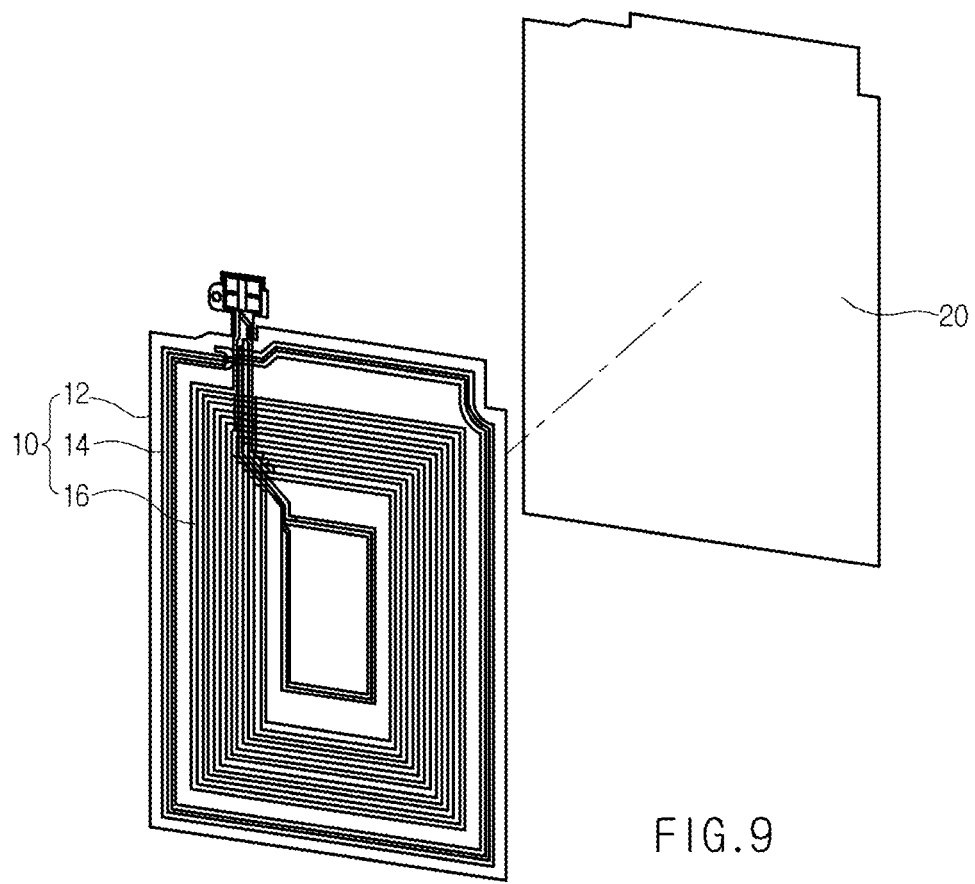

Referring to FIG. 9, an antenna module 10 in the related art is provided with radiation patterns 13 and 16 formed on one side of a flexible sheet 12. In this case, the radiation pattern 13 is a pattern for near field communication, and the radiation pattern 16 is a pattern for electronic payment. A magnetic sheet 20 is disposed on the rear side of the flexible sheet 12.

Referring to FIGS. 10 and 11 explaining comparison of communication performances of an antenna module according to the first embodiment of the present disclosure and an antenna module in the related art with each other, both the antenna module according to the first embodiment of the present disclosure and the antenna module in the related art show the performances that are equal to or higher than a reference value in near field communication.

However, the antenna module in the related art shows the performance that is equal to or lower than a reference value in electronic payment and communication performances to cause difficulty in applying the antenna module in the related art to an actual product, whereas the antenna module according to the first embodiment of the present disclosure implements a relatively higher inductance to improve the electronic payment and communication performance even with a size smaller than the size of the antenna module in the related art.

Figure 12:
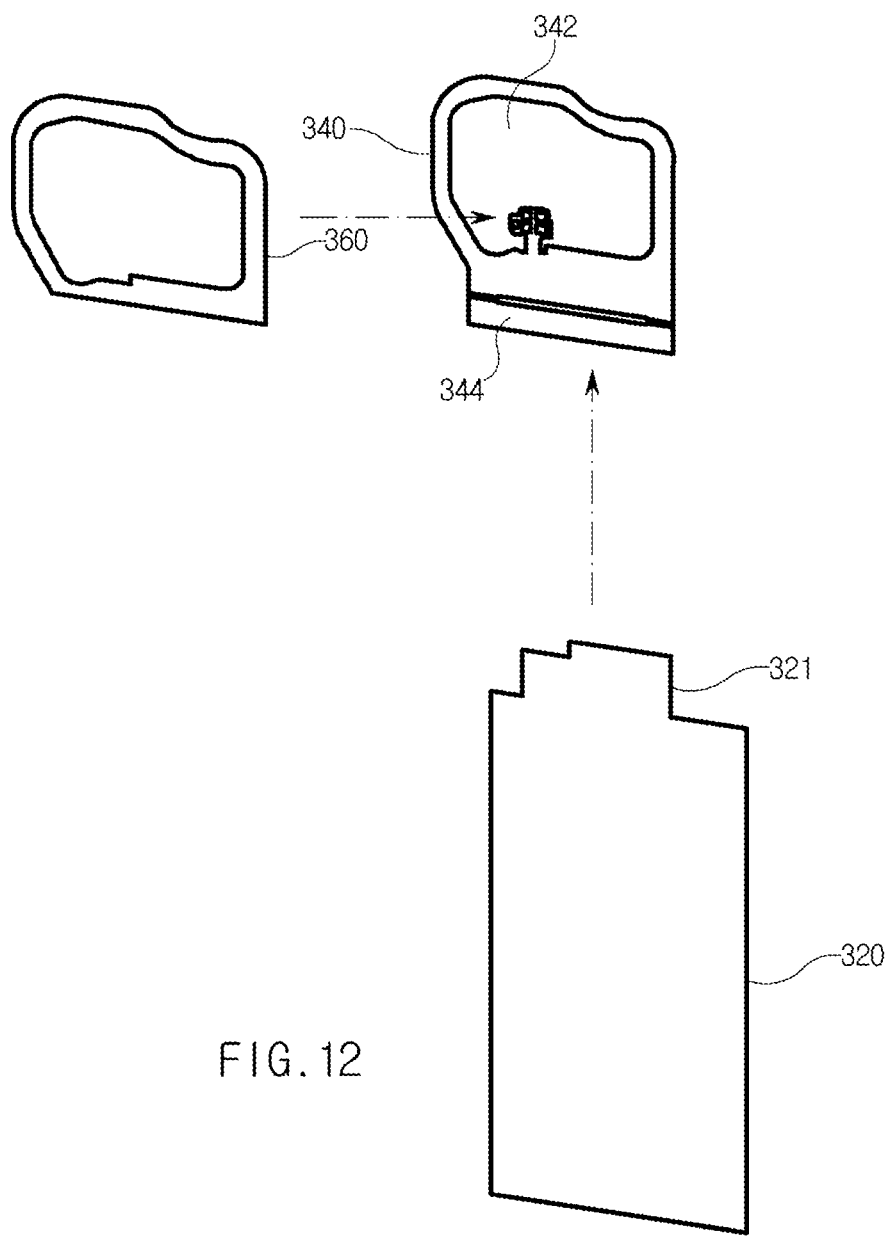
FIG. 12 is a view explaining an antenna module according to a second embodiment of the present disclosure.

Referring to FIG. 12, an antenna module according to a second embodiment of the present disclosure is configured to include a magnetic sheet 320, an antenna sheet 340, and a shielding sheet 360.

The magnetic sheet 320 operates as an auxiliary radiator of a radiation pattern formed on the antenna sheet 340. The magnetic sheet 320 is a plate-shaped material or film of a magnetic material. It is exemplified that the magnetic sheet 320 is one selected among a nano-sized crystalline alloy ribbon sheet, an iron-based amorphous ribbon sheet, and a ferrite sheet.

The characteristics of the iron-based amorphous sheet, such as permeability, can be controlled through hardening of the iron-based amorphous ribbon in a heat treatment process. In this case, it is exemplified that the iron-based amorphous ribbon is made of an iron-based magnetic alloy, and Fe—Si—B alloy may be used as the iron-based magnetic alloy. It is preferable that the iron-based magnetic alloy is an alloy containing 73-80 at % iron (Fe) content, 15-26 at % total silicon (Si) and boron (B) contents, and 1-5 at % total copper (Cu) and niobium (Nb) contents.

On the other hand, in the heat treatment process, the iron-based amorphous sheet is formed by heating the iron-based amorphous ribbon at a temperature of about 300° C. to 500° C. for about 0.1 to 10 hours.

It is exemplified that the nano-sized crystalline alloy ribbon sheet is an iron (Fe)-based magnetic alloy. In the same manner as the iron-based amorphous sheet, the characteristics of the nano-sized crystalline ally ribbon sheet, such as permeability, can be controlled through hardening of the iron-based amorphous ribbon in a heat treatment process. In this case, it is exemplified that the iron-based amorphous ribbon is made of an iron-based magnetic alloy, and Fe—Si—B—Cu—Nb alloy may be used as the iron-based magnetic alloy. In this case, the iron-based magnetic alloy may be an alloy containing 73-80 at % iron (Fe)

content, 15-26 at % total silicon (Si) and boron (B) contents, and 1-5 at % total copper (Cu) and niobium (Nb) contents.

On the other hand, in the heat treatment process, the nano-sized crystalline sheet, in which nano-sized crystalline is formed, is formed by heating the iron-based amorphous ribbon at a temperature of about 300° C. to 700° C. for about 30 minutes to 2 hours.

If the magnetic sheet 320 is formed in a hard state through the heat treatment, the magnetic sheet 320 may be damaged during mounting on the portable terminal, or it may be difficult to mount the magnetic sheet 320 on an uneven position.

Accordingly, it is preferable that the magnetic sheet 320 is in a soft state in which the heat treatment has not been performed with respect to the nano-sized crystalline alloy ribbon sheet, the iron-based amorphous ribbon sheet, or the ferrite sheet.

An adhesive sheet (not illustrated) for attaching the antenna module to the portable terminal is attached to the magnetic sheet 320. The adhesive sheet (not illustrated) is attached to one side of the magnetic sheet 320 that faces the portable terminal. If the adhesive sheet is attached to the one side of the magnetic sheet 320, a protection sheet may be attached to the other side of the magnetic sheet 320.

An extension portion 321 of a specific shape that is penetratingly inserted into the antenna sheet 340 may be formed on the magnetic sheet 320. The extension portion 321 is formed to extend in an outward direction from one short side of the magnetic sheet 320. The extension portion 321 may be formed so that one side of the extension portion 321 that is in parallel to the short side of the magnetic sheet 320 has a length (width) that is shorter than that of the short side of a base material.

Figure 13:
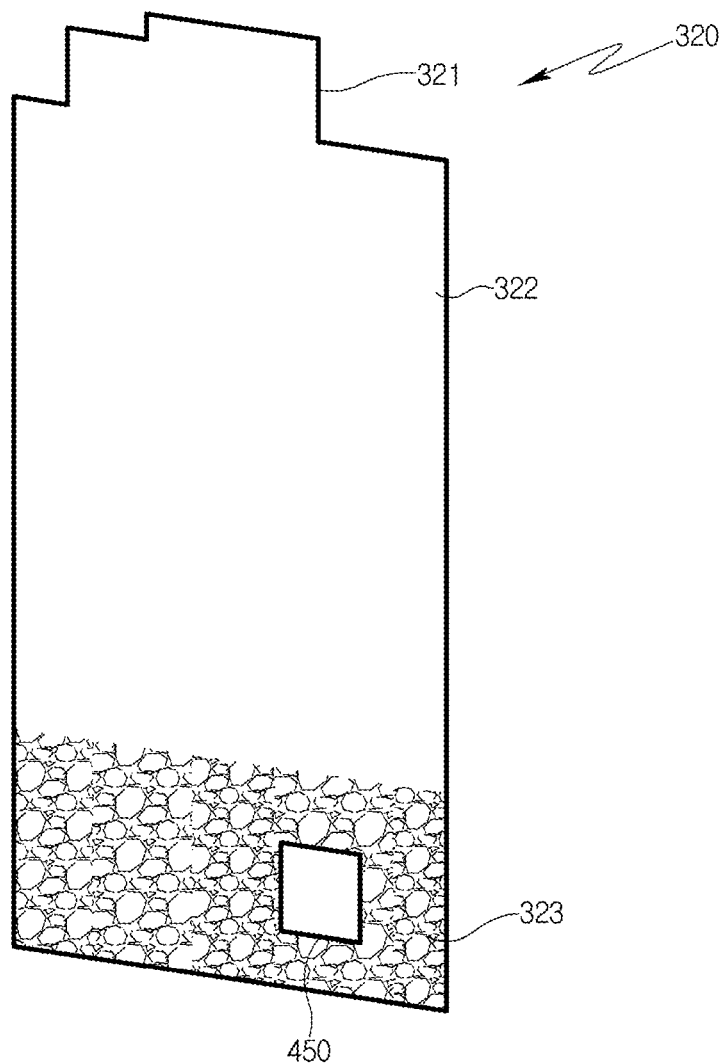
FIGS. 13 to 18 are views explaining a magnetic sheet of FIG. 12.

Referring to FIG. 13, a part of the magnetic sheet 320 may be formed in flakes through flake processing. When the antenna module is mounted on the portable terminal, one end portion of the magnetic sheet 320 that is disposed adjacent to a geomagnetic sensor 450 is separated into fine flakes through the flake processing.

The flake processing is performed after the protection sheet is attached to at least one of both sides of the magnetic sheet 320 to which the adhesive sheet is not attached. In this case, during the flake processing, only a partial region of the magnetic sheet 320 is pressed to be separated into fine flakes. However, the flake processing is not limited thereto, but only a partial region may be pressed to be separated into fine flakes after the protection sheet is attached to one side of the magnetic sheet 320.

The magnetic sheet 320 may be divided into a first region in which flake processing has not been performed and a second region in which the flake processing has been performed. The second region 323 is formed to be separated into non-uniform fine flakes, and it has an area that is narrower than the area of the first region 322. In this case, the second region 323 may be formed to have an area that is equal to or smaller than 30% or less of the total area (i.e., area including the first region 322 and the second region 323).

Figure 14:
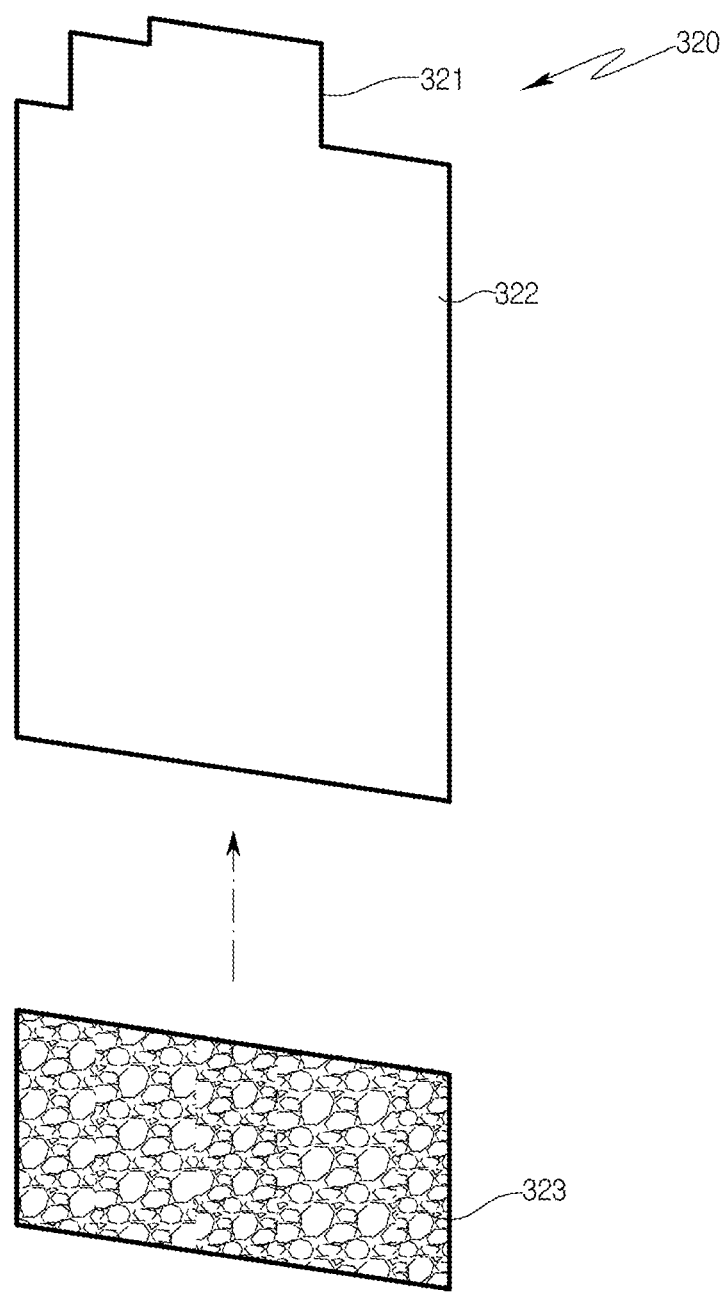

On the other hand, referring to FIG. 14, the magnetic sheet 320 may be formed to be separated into the first region 322 and the second region 323. That is, the magnetic sheet 320 may be formed by bonding the first region 322 in which the flake processing has not been performed and the second region 323 in which the flake processing has been performed. In this case, the first region 322 and the second region 323 may be formed of the same material or different materials.

The second region 323 is formed to be separated into fine flakes through flake processing. The second region 323 is coupled to one end of the first region 322. In this case, since the antenna module is mounted on the portable terminal, the second region 323 may be disposed in a position adjacent to the geomagnetic sensor 450.

Figure 15:
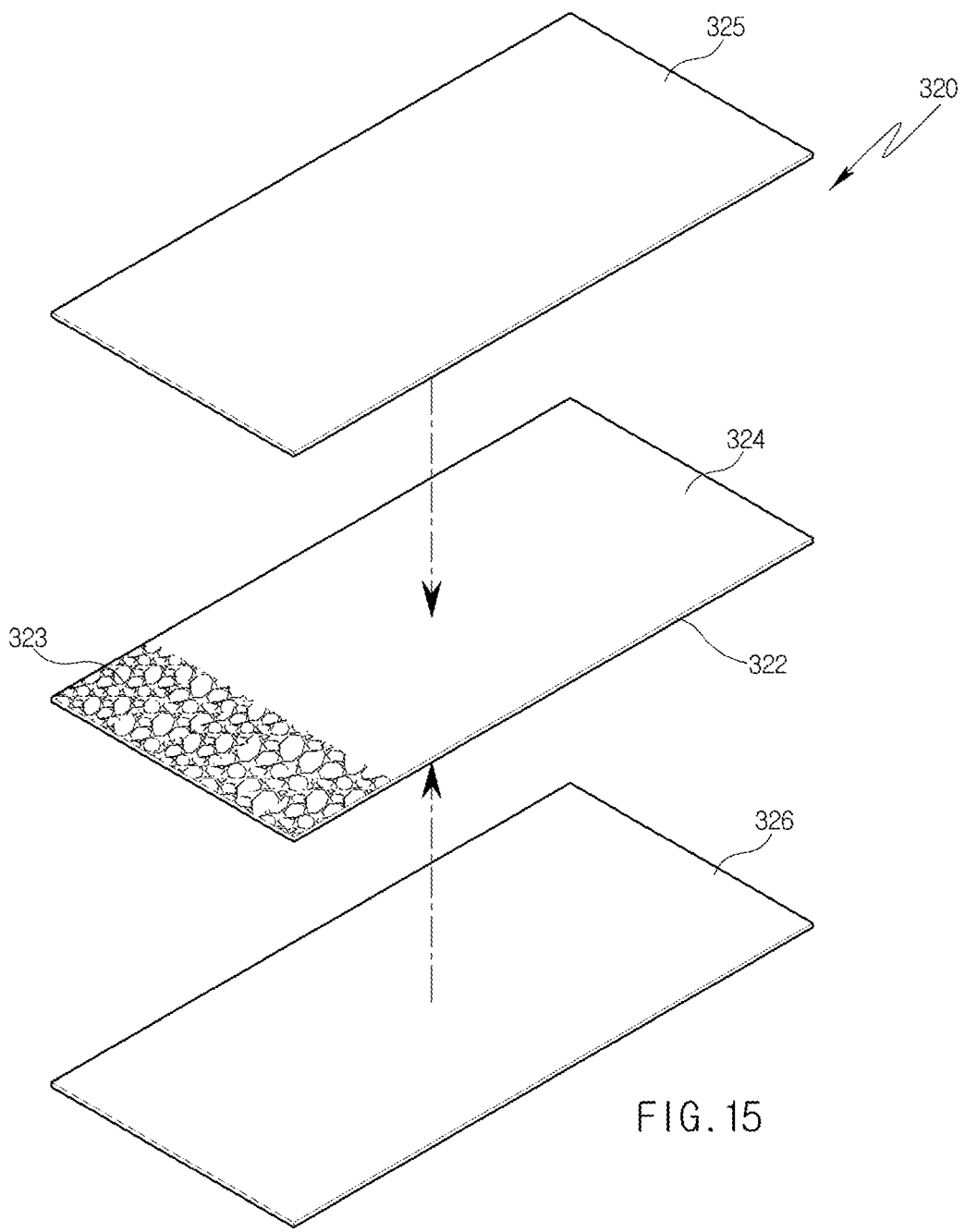
Figure 16:
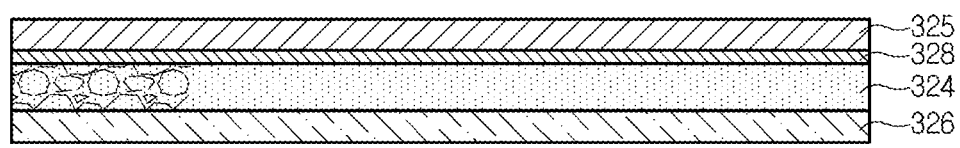

As an example, referring to FIGS. 15 and 16, the magnetic sheet 320 may include a thin-plate magnetic sheet 324, a protection film 325, and a release film 326. The thin-plate magnetic sheet may be composed of a single sheet or may have a multilayer structure in which a plurality of sheet are laminated. It is exemplified that the thin-plate magnetic sheet is one selected among a nano-sized crystalline alloy ribbon sheet, an iron-based amorphous ribbon sheet, and a ferrite sheet.

The thin-plate magnetic sheet 324 is composed of any one of a nano-sized crystalline sheet and an iron-based amorphous sheet. In this case, the thin-plate magnetic sheet 324 may be configured through lamination of any one of a nano-sized crystalline sheet and an iron-based amorphous sheet in two or more layers.

The protection film 325 may be formed on one side of the thin-plate magnetic sheet 324. In this case, an adhesive layer (or adhesive sheet) 328 may be formed between the protection film 325 and the thin-plate magnetic sheet 324.

The release film 326 may be formed on the other side of the thin-plate magnetic sheet 324. That is, the removable release film 326 may be formed on the other side of the thin-plate magnetic sheet 324 that is opposite to the one side thereof on which the protection film 325 is formed.

The thin-plate magnetic sheet 324 overlaps the antenna sheet 340 at least partly, and the flake processing is performed only in the region that does not overlap the radiation pattern. Through this, the thin-plate magnetic sheet 324 may be divided into the first region 322 in which the flake processing has not been performed and the second region 323 in which the flake processing has been performed. In this case, the first region 322 is formed to have an area that is wider than the area of the second region 323. Since the antenna module is mounted on the portable terminal, the second region 323 is disposed in a position adjacent to the geomagnetic sensor 450.

Since the flake processing is performed with respect to a part of the magnetic sheet 320, permeability is lowered in comparison with that before the flake processing and a saturated magnetic field is increased.

The magnetic sheet 320 has a reduced magnetic hysteresis phenomenon due to the decrease of the permeability decrease and the increase of the saturated magnetic field, and thus an influence exerted on the geomagnetic sensor 320 due to the magnetic field generated in the antenna module can be minimized.

At the same time, reduction of the area of the magnetic sheet 320 is minimized, and thus it is possible to implement the performance that is equal to or higher than the performance of the antenna module before the flake processing.

A radiation pattern for electronic payment and a radiation pattern for near field communication are formed on the antenna sheet 340. The antenna sheet 340 is coupled to the magnetic sheet 320 since the magnetic sheet 320 is penetratingly inserted into an insertion hole 344 formed inside the radiation pattern for electronic payment.

The antenna sheet 340 may be a flexible printed circuit board including a radiation pattern formed on at least one of an upper side and a lower side. In this case, the radiation pattern may include both the radiation pattern for near field communication and a radiation pattern for electronic payment.

On the antenna sheet 340, a loop hole 342 and the insertion hole 344 are formed spaced apart from each other. In this case, the loop hole 342 may be in the form of a polygon, such as a rectangle or a circle. The insertion hole 344 may be in the form of a slit. Here, in the case where the antenna module is mounted on the rear cover of the portable terminal, holes formed on the rear cover (e.g., camera hole and illumination hole) may be disposed in the loop hole 342.

The radiation pattern for near field communication is in the form of a loop wound multiple times along an outer periphery of the loop hole 342 of the flexible printed circuit board. In this case, the radiation pattern for near field communication is formed only on one side of the flexible printed circuit board.

The radiation pattern for electronic payment is in the form of a loop wound multiple times along the outer periphery of the insertion hole 344 of the flexible printed circuit board. In this case, the radiation pattern for electronic payment may be formed on one side or both sides of the flexible printed circuit board.

In the case where the radiation pattern for electronic payment is formed only on one side of the flexible printed circuit board, it is preferable that the radiation pattern for electronic payment is formed on the other side of the flexible printed circuit board that is opposite to the one side on which the radiation pattern for near field communication is formed. In this case, the radiation pattern for electronic payment may be formed to be wound multiple times on the outer periphery of the insertion hole 344, and then to be wound at least once on the outer periphery of the loop hole 342.

In the case where the radiation pattern for electronic payment is formed on both sides of the flexible printed circuit board, one end of the radiation pattern for electronic payment formed on one side of the flexible printed circuit board is connected to one end of the radiation pattern for electronic payment formed on the other side of the flexible printed circuit board through a via-hole. In this case, the radiation pattern for electronic payment formed on the one side on which the radiation pattern for near field communication may be formed to be wound multiple times on the outer periphery of the insertion hole 344, and then to be wound at least once on the outer periphery of the loop hole 342.

On the antenna sheet 340, a terminal portion extending from the flexible printed circuit board may be formed. In this case, the terminal portion may include a plurality of terminals formed at both ends of the radiation pattern for near field communication and both ends of the radiation pattern for electronic payment. Here, it is preferable that the terminal portion is formed to extend to the inside of the loop hole 342 in order to minimize a mounting space for the antenna module.

The shielding sheet 360 is attached to one side of the antenna sheet 340. In this case, the shielding sheet 360 is attached to the one side of the antenna sheet 340 on which the radiation pattern for near field communication is not formed.

The shielding sheet 360 is disposed to overlap the radiation pattern for near field communication. The shielding sheet 360 may be formed to cover only a region of the antenna sheet 340 on which the radiation pattern for near field communication is formed.

Figure 17:
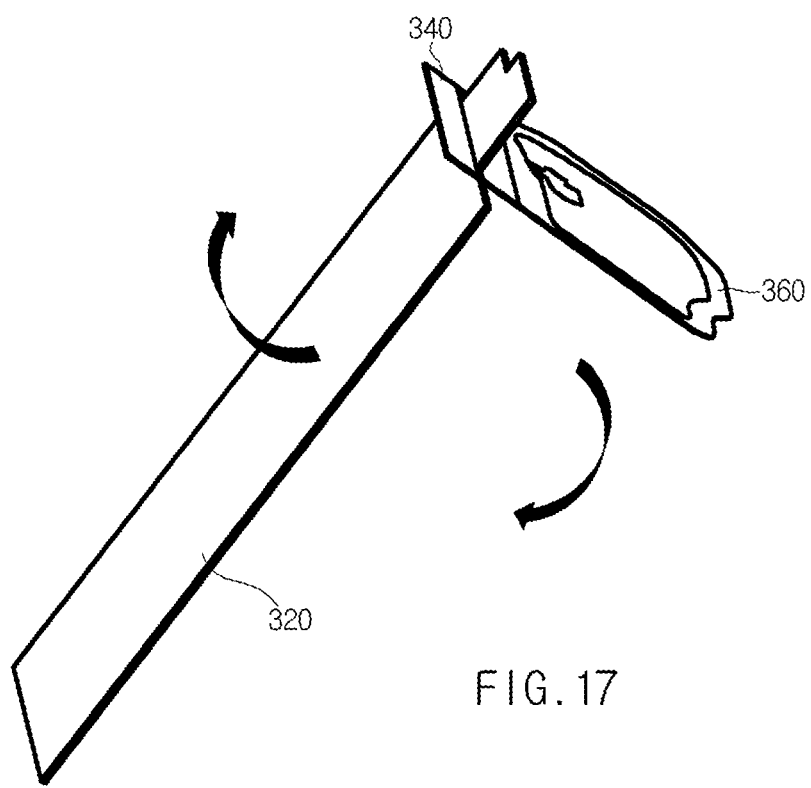

Referring to FIG. 17, the magnetic sheet 320 is penetratingly inserted into the insertion hole 344 of the antenna sheet 340 having one side to which the shielding sheet 360 is attached. An extension portion 321 of the magnetic sheet 320 is penetratingly inserted into the insertion hole 344 of the magnetic sheet 320. The magnetic sheet 320 is coupled to the antenna sheet 340 vertically (i.e., at right angles).

The magnetic sheet 320 and the antenna sheet 340 are flattened by rotating the magnetic sheet 320 clockwise. The magnetic sheet 320 and the antenna sheet 340 are flattened by rotating the antenna sheet 340 counterclockwise. The magnetic sheet 320 and the antenna sheet 340 are coupled to each other through a lamination process. The antenna sheet 340 and the magnetic sheet 320 may be attached to each other through adhesives interposed between overlapping regions thereof.

Figure 18:
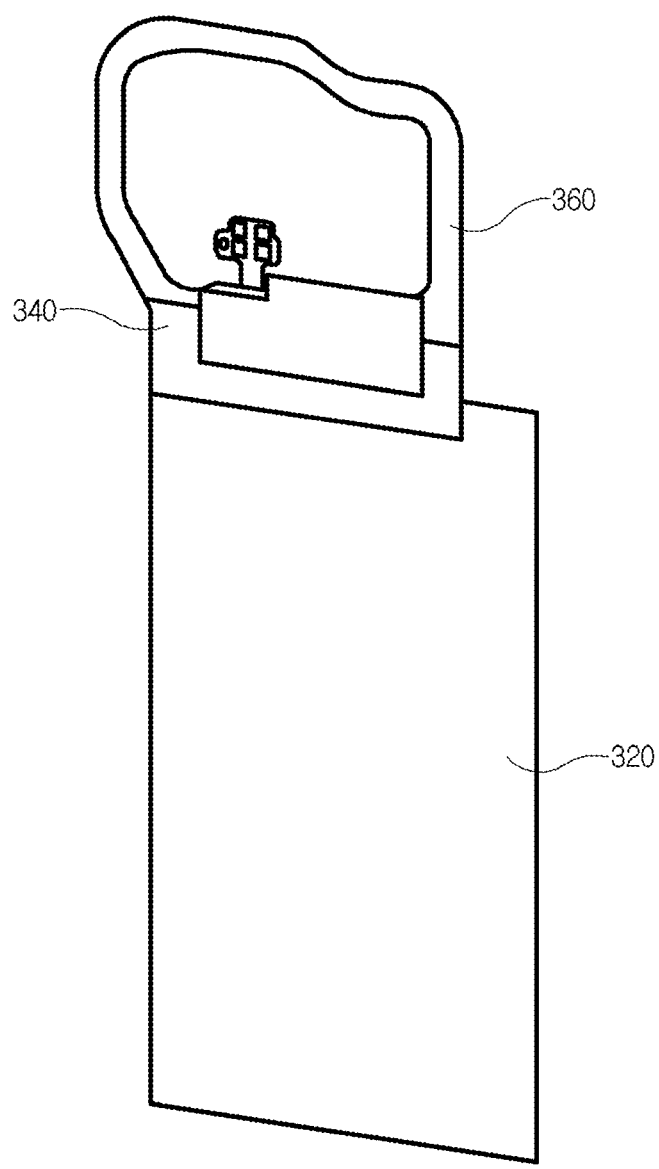

Referring to FIG. 18, since the magnetic sheet 320 and the antenna sheet 340 are coupled to each other, the magnetic sheet 320 partially overlaps the radiation pattern for electronic payment and the radiation pattern for near field communication. The magnetic sheet 320 may operate as an auxiliary radiator for the radiation pattern for electronic payment and the radiation pattern for near field communication by an electromagnetic coupling effect occurring in a region that overlaps the radiation pattern (i.e., the radiation pattern for electronic payment and the radiation pattern for near field communication). Here, the electromagnetic coupling effect means electromagnetic coupling of the radiation pattern and the magnetic sheet 320 in a state where the radiation pattern and the magnetic sheet 320 are not directly connected with each other (i.e., they are spaced apart from each other).

Figure 19:
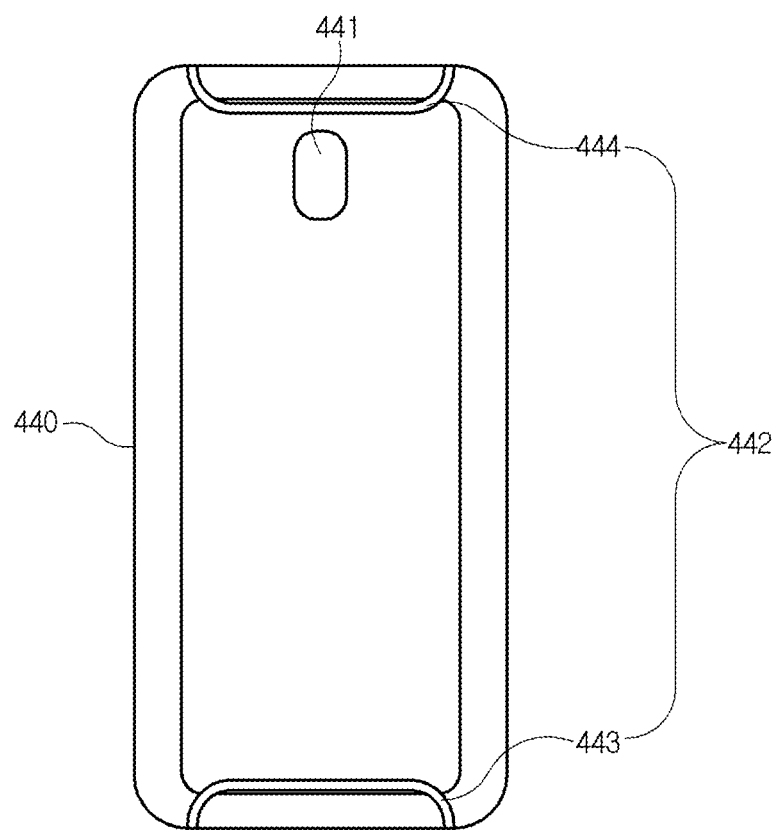
FIGS. 19 and 20 are views explaining a portable terminal to which an antenna module according to a third embodiment of the present disclosure is applied.
Figure 20:
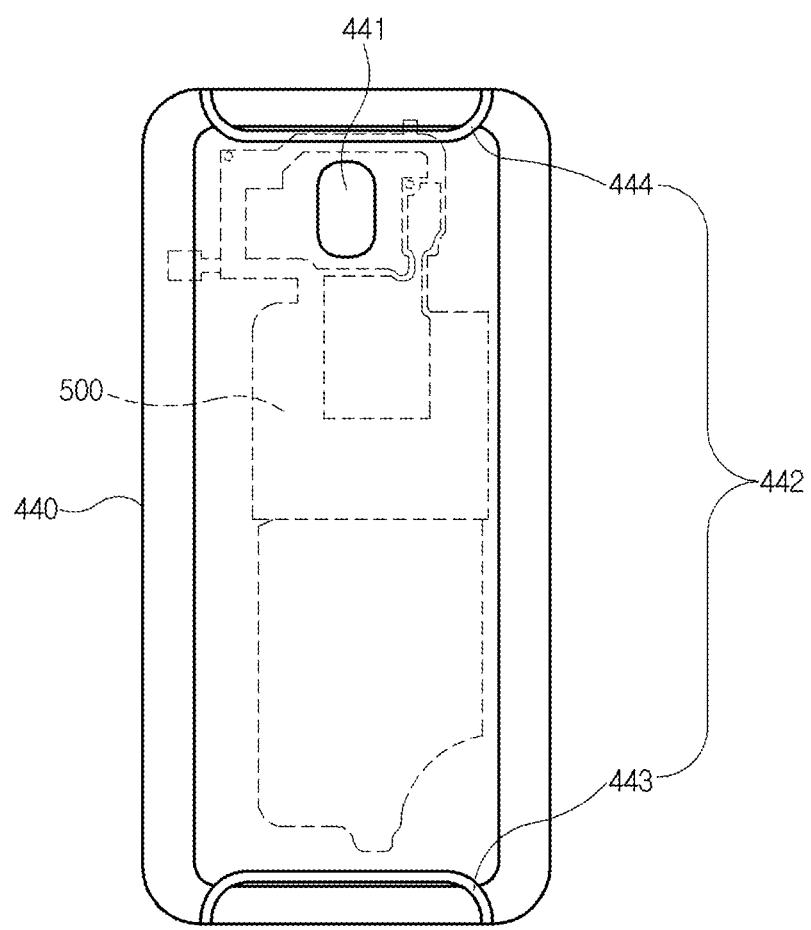

Referring to FIGS. 19 and 20, a slit (or segment) 442 for passing through a magnetic field of a radiation pattern is formed on the rear cover 440 of the portable terminal in order to form a radiation field for electronic payment and near field communication. In this case, a first slit 443 formed adjacent to one short side of the rear cover 440 and a second slit 444 formed between a camera hole 441 and the other short side of the rear cover 440 may be formed on the rear cover 440. Here, the camera hole 441 means a hole in which at least one of a camera and illumination is disposed on the rear side of the portable terminal.

An antenna module 500 according to the third embodiment of the present disclosure is mounted on the rear cover 440 of the portable terminal. In this case, one end of the antenna module 500 is disposed spaced apart for a predetermined distance from the first slit 443, and the other end of the antenna module 500 is disposed to partially overlap the second slit 444.

Figure 21:
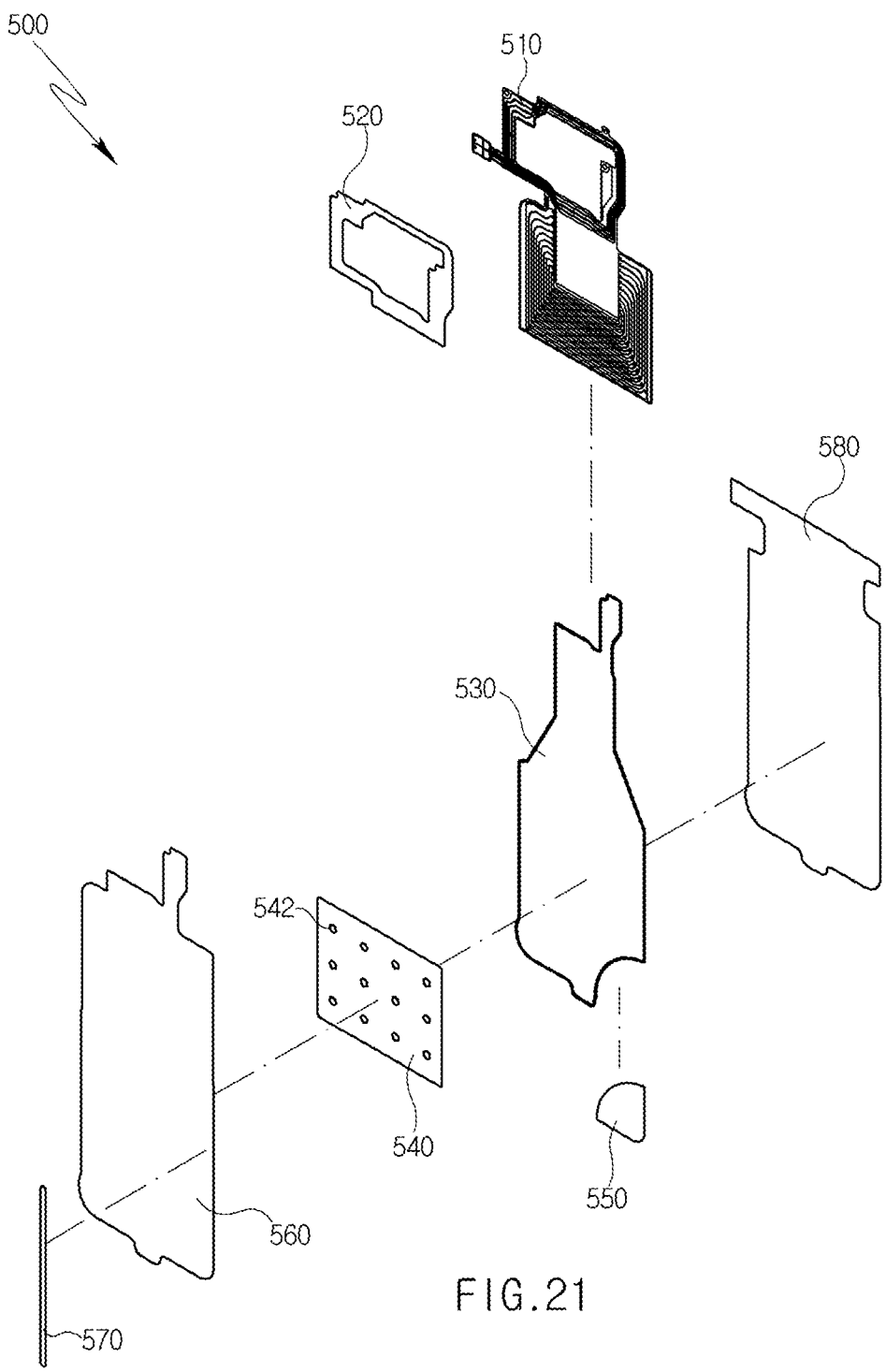
FIGS. 21 and 22 are views explaining an antenna module according to a third embodiment of the present disclosure.
Figure 22:
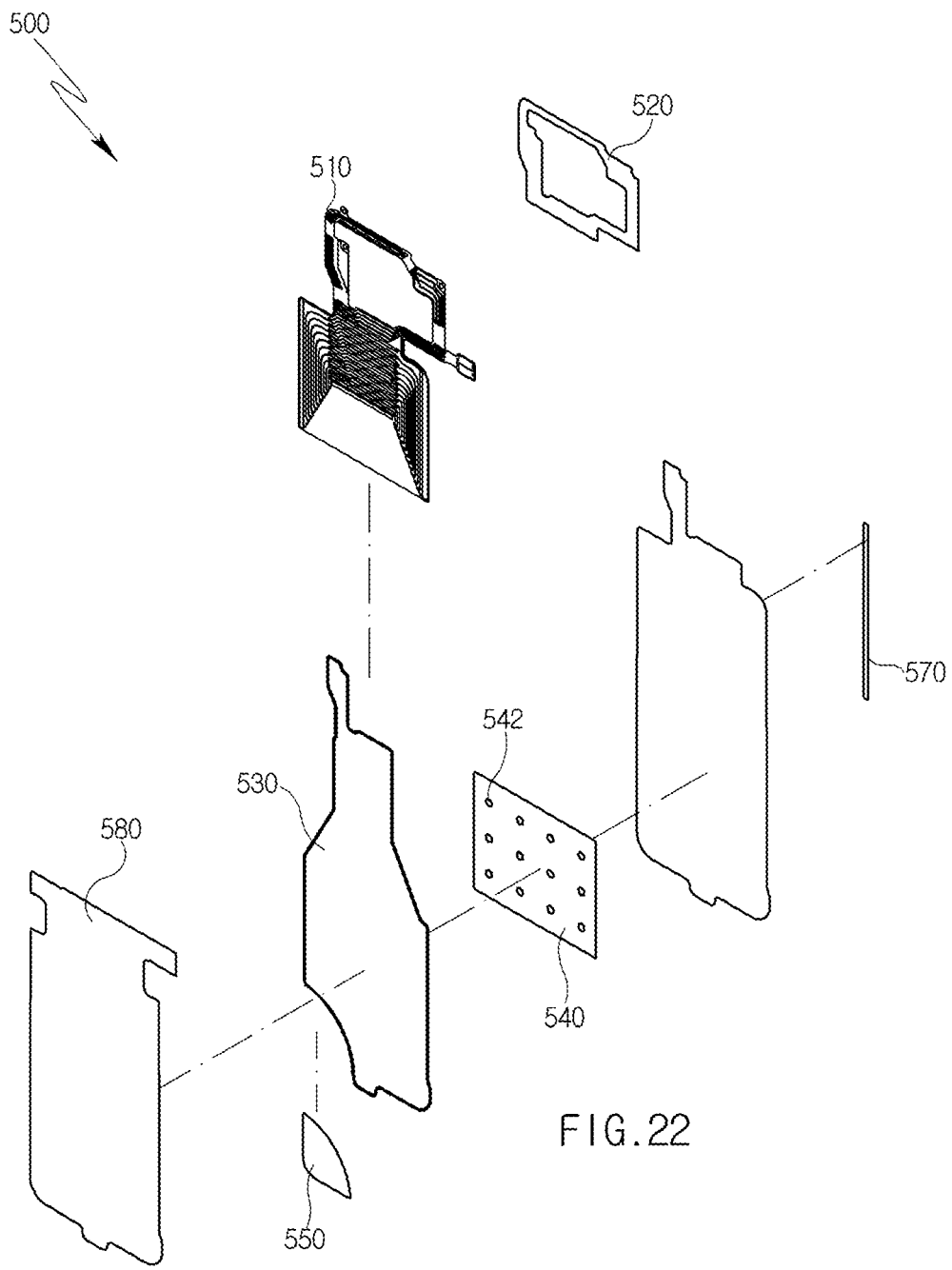

Referring to FIGS. 21 and 22, the antenna module 500 according to the third embodiment of the present disclosure is configured to include an antenna sheet 510, a shielding sheet 520, a magnetic sheet 530, a first step height compensation sheet 540, a second step height compensation sheet 560, a protection sheet 560, a third step height compensation sheet 570, and an adhesive sheet 580. Hereinafter, it can be understood that a front side means one side in a direction toward an inside of the portable terminal (i.e., direction of the main body), and a rear side means the other side toward an outside of the portable terminal (i.e., direction of the rear cover 440).

Figure 23:
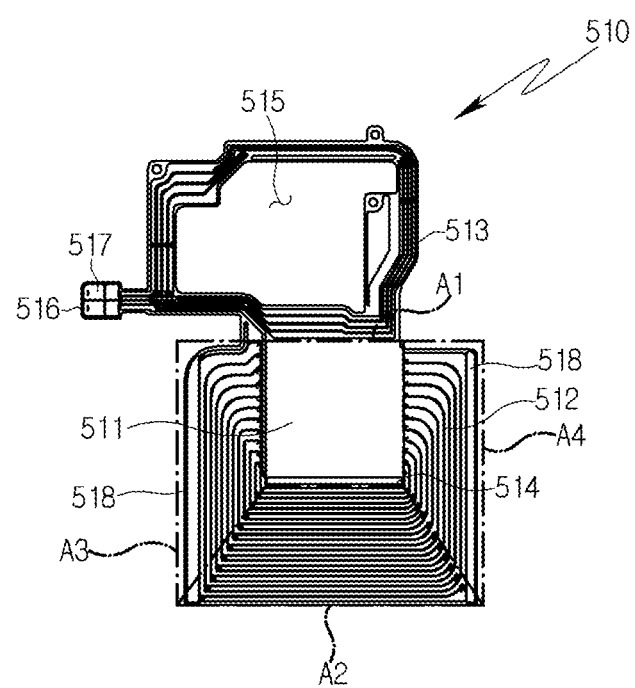
FIGS. 23 and 24 are views explaining an antenna sheet of FIG. 21.
Figure 24:
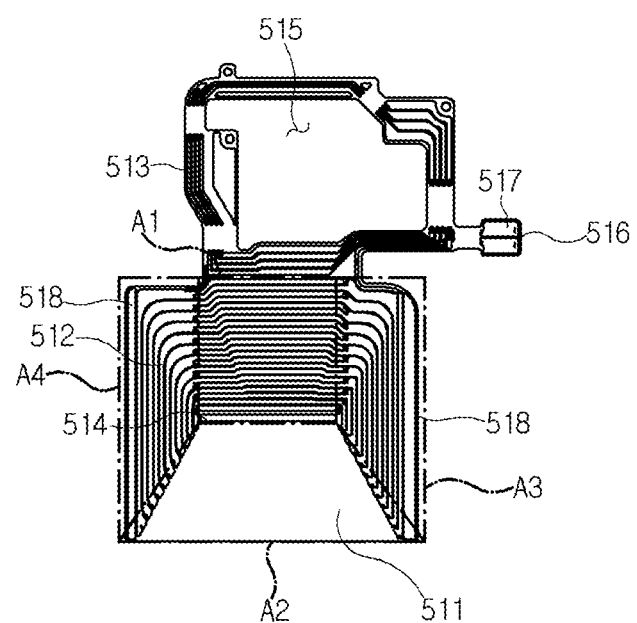

Referring to FIGS. 23 and 24, the antenna sheet 510 is composed of a flexible board 511 on which a first radiation pattern 512 and a second radiation pattern 513 are formed. In this case, it is exemplified that the first radiation pattern 512 is a radiation pattern for electronic payment (e.g., magnetic secure transmission (MST)), and the second radiation pattern 513 is a radiation pattern for near field communication (e.g., NFC).

The flexible substrate 511 may be formed of a material having flexibility, such as polyimide (PI), polyethylene phthalate (PET), or thermoplastic poly urethane (TPU).

On the flexible board 511, an insertion hole 514 and an accommodation hole 515 are formed to be spaced apart from each other. In this case, the insertion hole 514 is a hole into which the magnetic sheet 530 is penetratingly inserted, and may be in the form of a slit 420 having a long side and a short side. The accommodation hole 515 is a hole in which a hole (e.g., camera hole 52) formed on the rear cover 440 of the portable terminal is accommodated, and may be in various shapes in accordance with the portable terminal on which the antenna module 500 is mounted.

The first radiation pattern 512 is in the form of a loop wound multiple times on the outer periphery of the insertion hole 514 of the flexible board 511. In this case, the first radiation pattern 512 may be formed at least one of a front side and a rear side of the flexible board 511.

In this case, a region of the flexible board 511 on which the first radiation pattern 512 is formed may be divided into a first region A1, a second region A2, a third region A3, and a fourth region A4 in accordance with a relative position to the insertion hole 514 and whether to overlap the magnetic sheet 530.

The first region A1 is a region which is disposed on an upper portion of the insertion hole 514 and on which the magnetic sheet 530 overlaps the rear side thereof. In this case, the first radiation pattern 512 is formed only on the front side of the first region A1 that does not overlap the magnetic sheet 530.

The second region A2 is a region which is disposed on a lower portion of the insertion hole 514 and on which the magnetic sheet 530 overlaps the front side thereof. In this case, the first radiation pattern 512 is formed only on the rear side of the second region A2 that does not overlap the magnetic sheet 530.

The third region A3 and the fourth region A4 are regions which are disposed opposite to each other on a side portion of the insertion hole 514 and which do not overlap the magnetic sheet 530. In this case, since the insertion hole 514 is formed to have a maximum width D in order to heighten the performance of the first radiation pattern 512 (i.e., performance for electronic payment), the third region A3 and the fourth region A4 are relatively narrowed. That is, an area for forming the first radiation pattern 512 is narrowed.

If the first radiation pattern 512 is formed in the third region A3 and the fourth region A4 with the same number of turns as that in the first region A1 and the second region A2, the line width of the first radiation pattern 512 is narrowed to cause the resistance to be increased, and thus the antenna performance is deteriorated.

Accordingly, the first radiation pattern 512 is formed on the front and rear sides of the third region A3 and the fourth region A4. In this case, the number of turns of the first radiation pattern 512 formed on the third region A3 and the fourth region A4 is reduced to a half of the number of turns of the first radiation pattern 512 formed on the first region A1 and the second region A2, and the line width thereof is increased to minimize the increase of the resistance.

The first radiation patterns 512 disposed on the front side and the rear side of the flexible board 511 are connected to each other through a via-hole to constitute an antenna for electronic payment in the form of a loop wound around the insertion hole 514.

In the case where the first radiation pattern 512 is formed only on one side of the flexible board 511, the first radiation pattern 512 may be formed on the other side of the flexible board 511 that is opposite to the one side thereof on which the second radiation pattern 513 is formed. As an example, in the case where the first radiation pattern 512 is formed on the front side of the flexible board 511, the second radiation pattern 513 is formed on the rear side of the flexible board 511.

In the case where the first radiation pattern 512 is faulted on both sides (i.e., front and rear sides) of the flexible board 511, it is exemplified that the first radiation pattern 512 is composed of a plurality of patterns respectively disposed on the front and rear sides of the flexible board 511, and each of the plurality of patterns is connected to another pattern formed on the opposite side through the via-hole to constitute the first radiation pattern 512.

The second radiation pattern 513 is in the form of a loop wound multiple times on the outer periphery of the accommodation hole 515 of the flexible board 511. In this case, the second radiation pattern 513 may be in the form of a loop wound multiple times on the outer periphery of the accommodation hole 515 on the front and rear sides of the flexible board 511.

The second radiation pattern 513 may be composed of a plurality of patterns, and may be in the form of a loop wound multiple times on the outer periphery of the accommodation hole 515 on the front and rear sides of the flexible board 511. In this case, it is exemplified that the plurality of patterns are disposed spaced apart from each other on the front and rear sides of the flexible board 511, and each of the plurality of patterns is connected to another pattern formed on the opposite side through the via-hole to constitute the second radiation pattern 513.

The antenna sheet 510 may be configured to further include a connection portion 516 connecting the first radiation pattern 512 and the second radiation pattern 513 to a main circuit board of the portable terminal. In this case, the terminal portion 516 includes a plurality of terminals 517 respectively connected to both ends of the first radiation pattern 512 and both ends of the second radiation pattern 513, and is formed to extend from one side of the flexible board 511.

Figure 25:
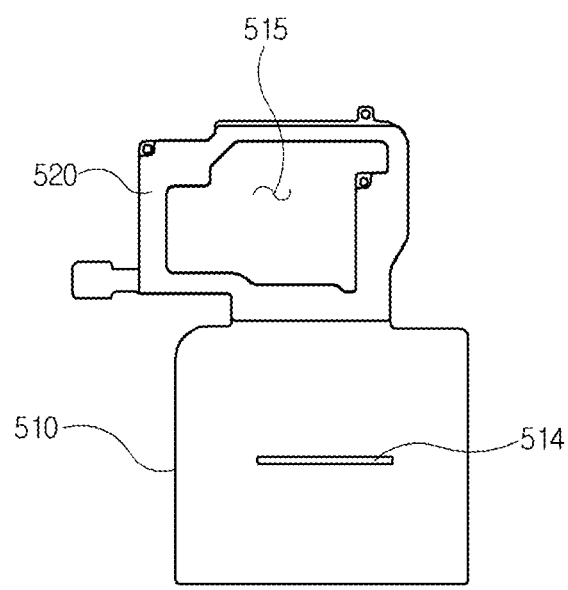
FIG. 25 is a view explaining a shielding sheet of FIG. 21.

Referring to FIG. 25, the shielding sheet 520 is attached to the front side of the antenna sheet 510. In this case, the shielding sheet 520 is attached to the front side of the antenna sheet 510, and the radiation pattern of the antenna sheet 510 forms a radiation field in a rearward direction of the portable terminal. The shielding sheet 520 is formed to cover the region of the antenna sheet 510 on which the second radiation pattern 513 is formed, and a hole corresponding to the accommodation hole 515 of the antenna sheet 510 is formed in the shielding sheet 520.

The magnetic sheet 530 may be formed of a thin film metal as an auxiliary radiator of the first radiation pattern 512 formed on the antenna sheet 510. In this case, it is exemplified that the magnetic sheet 530 is formed of one metal material selected among a nano-sized crystalline alloy, an iron-based amorphous alloy, and a ferrite. Here, it is exemplified that the nano-sized crystalline alloy is a Fe-based magnetic ally, and a Fe—Si—B—Cu—Nb alloy may be used as the Fe-based magnetic alloy. In this case, it is preferable that the Fe-based magnetic alloy contains 73-80 at % Fe, 15-26 at % total Si and B, and 1-5 at % total Cu and Nb.

The magnetic sheet 530 is formed of a metal material in a soft state in which heat treatment has not been performed.

That is, if the magnetic sheet 530 is formed in a hard state through heat treatment of the metal material, the magnetic sheet 530 may be damaged in the process of mounting an antenna module 500 on a portable terminal to deteriorate the antenna performance, or it may be difficult to mount the magnetic sheet 530 on an uneven position. Accordingly, it is preferable that the magnetic sheet 530 is in a soft state in which the heat treatment has not been performed.

Figure 26:
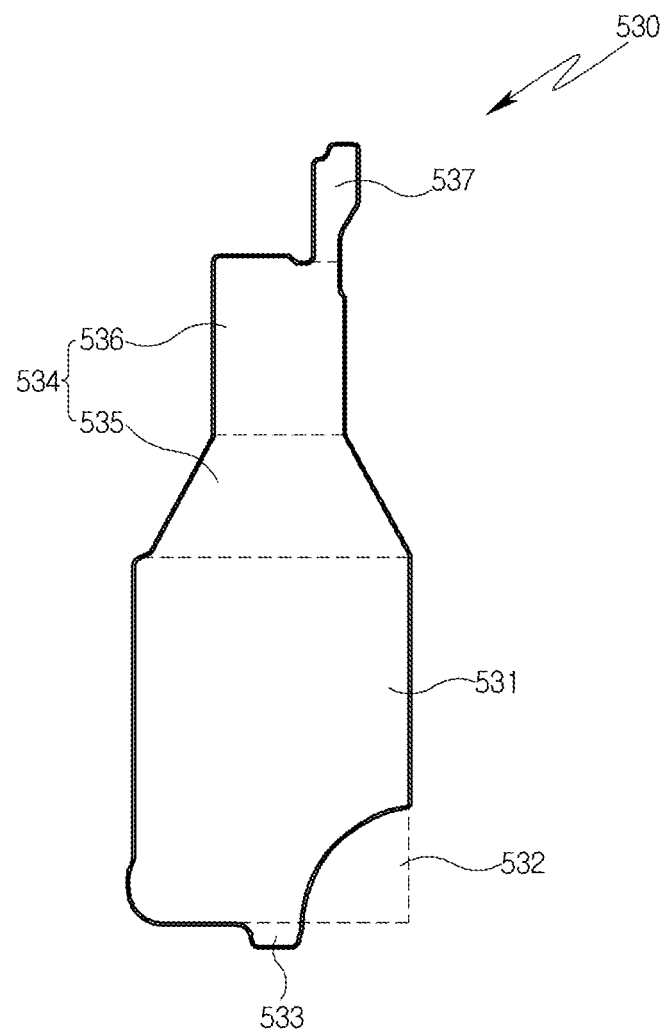
FIG. 26 is a view explaining a magnetic sheet of FIG. 21.

Referring to FIG. 26, the magnetic sheet 530 is in the form of a rectangle, and includes a base region 531 that becomes a basis of the magnetic sheet 530.

In the base region 531, a concave region 532 for preventing interference occurrence of a geomagnetic sensor is formed. That is, if the magnetic sheet 530 overlaps the geomagnetic sensor mounted in the portable terminal, interference occurs in the geomagnetic sensor due to permeability of the magnetic sheet 530, and thus sensing accuracy of the geomagnetic sensor is deteriorated.

In the third embodiment of the present disclosure, the concave region 532 is formed in the base region 531 to prevent the magnetic sheet 530 and the geomagnetic sensor from overlapping each other. Here, the concave region 532 means a region from which the metal has been removed through cutting off a part of the base region 531.

Since the rear cover 440 of the portable terminal is formed of a metal material, it shields a magnetic field emitted from the radiation pattern (i.e., the first radiation pattern 512 and the second radiation pattern 513).

Since the radiation pattern (i.e., the first radiation pattern 512 and the second radiation pattern 513) or the magnetic sheet 530 is disposed adjacent to the slit 442, the antenna module 500 can increase the amount of the magnetic field emitted to an outside of the portable terminal, and thus a strong radiation field can be formed.

However, since various materials, such as a main circuit board, battery, and a structure for coupling or support, are disposed in the portable terminal, it is difficult to dispose the magnetic sheet 530 adjacent to the slit 442.

In the third embodiment of the present disclosure, a lower projection region 533 is formed to project from one side of the base region 531 toward an external direction (i.e., direction of a first slit 443). The lower projection region 533 is formed to project from one of four sides of the base region 531 in the direction of the first slit 443. The lower projection region 533 is disposed to be spaced apart for a predetermined distance from the first slit 443. In this case, the lower projection region 533 is disposed maximally adjacent to the first slit 443.

The width of the lower projection region 533 may be set to be narrower than the width of one side of the base region 531, and the projection position may be changed within the one side in accordance with a material disposal structure of the portable terminal.

In the base region 531, an overlapping region 534 is formed to penetrate the insertion hole 514 and to overlap the first radiation pattern 512. In this case, the overlapping region 534 is formed to extend from the other side of the base region 531 and is disposed opposite to the lower projection region 533.

The overlapping region 534 may be divided into a first overlapping region 535 extending from the other side of the base region 531 and disposed on the rear side of the antenna sheet 510 and a second overlapping region 536 extending from the first overlapping region 535 and disposed on the front side of the antenna sheet 510.

The first overlapping region 535 is disposed on the rear side of the antenna sheet 510, and overlaps the first radiation pattern 512 formed on the lower portion of the insertion hole 514. The second overlapping region 536 is disposed on the front side of the antenna sheet 510 to penetrate the insertion hole 514, and overlaps the first radiation pattern 512 formed on the upper portion of the insertion hole 514.

In this case, the width of the second overlapping region 536 is set to be equal to or smaller than the width of the insertion hole 514, and the width of the first overlapping region 535 becomes smaller as the first overlapping region 535 gets closer to the second overlapping region 536.

As an example, the first overlapping region 535 is in the form of a trapezoid of which the lower side is longer than the upper side thereof, and the lower side of the first overlapping region 535 is connected to the other side of the base region 531 and the upper side of the first overlapping region 535 is connected to the second overlapping region 536. In this case, the upper side of the first overlapping region 535 has a length that is equal to or smaller than the width of the insertion hole 514.

The second overlapping region 536 is formed to extend from the upper side of the first overlapping region 535. The second overlapping region 536 is disposed on the front side of the antenna sheet 510 after penetrating the insertion hole 514 from the rear side of the antenna sheet 510 toward the direction of the front side.

On the other hand, an adhesive material (not illustrated) for attaching the antenna sheet 510 and the magnetic sheet 530 to each other may be interposed between the first overlapping region 535 and the rear side of the antenna sheet 510 and between the second overlapping region 536 and the front side of the antenna sheet 510.

An upper projection region 537 for improving the antenna performance of the first radiation pattern 512 may be formed on the second overlapping region 536.

The upper projection region 537 is formed to extend from the second overlapping region 536. In this case, the upper projection region 537 is formed to extend in a direction opposite to the first overlapping region 535. In this case, the upper projection region 537 is disposed maximally adjacent to the first slit 443. The width of the upper projection region 537 is set to be narrower than the width of the one side of the connected second overlapping region 536.

The upper projection region 537 overlaps the second radiation pattern 513 and a part of the shielding sheet 520, and is disposed to be spaced apart for a predetermined distance from a second slit 444. In this case, in the antenna module 500 according to the third embodiment of the present disclosure, since the upper projection region 537 of the magnetic sheet 530 is disposed to overlap the shielding sheet 520, a part of the shielding sheet 520 disposed to overlap the upper projection region 537 operates as an auxiliary radiator of the first radiation pattern 512 to improve the antenna performance of the first radiation pattern 512.

Here, for easy explanation of the magnetic sheet 530, it is exemplified that the magnetic sheet 530 is separated into the base region 531, the lower projection region 533, the overlapping region 534 (i.e., the first overlapping region 535 and the second overlapping region 536), and the upper projection region 537, but the configuration of the magnetic sheet 530 is not limited thereto, and in an actual product, the base region 531, the lower projection region 533, the overlapping region 534 (i.e., the first overlapping region 535 and the second overlapping region 536), and the upper projection region 537 may be integrally formed.

The first step height compensation sheet 540 compensates for the step height between the antenna sheet 510 and the magnetic sheet 530. That is, the first step height compensation sheet 540 is disposed on the front side of the magnetic sheet 530 to compensate for the step height occurring between the antenna sheet 510 and the magnetic sheet 530 since the magnetic sheet 530 is penetratingly inserted into the antenna sheet 510.

The first step height compensation sheet 540 is formed to have the thickness corresponding to the thickness of the antenna sheet 510. In this case, the thickness of the first step height compensation sheet 540 may be set to be equal to the thickness of the flexible board 511 of the antenna sheet 510 and the radiation pattern.

The first step height compensation sheet 540 is disposed on the base region 531 of the magnetic sheet 530. In this case, the first step height compensation sheet 540 is disposed on a part of the base region 531 and is disposed to be inclined toward the direction of the overlapping region 534.

This is to compensate for the step height caused by a sticker attached to a battery (e.g., sticker for bearing battery specifications). That is, it is exemplified that the first step height compensation sheet 540 is disposed on the base region 531 of the magnetic sheet 530, but it is formed on a region excluding the region that overlaps the sticker attached to the battery.

The first step height compensation sheet 540 includes a plurality of air accommodation holes 542 that are spaced apart from each other. The air accommodation holes 542 accommodate an air inflow between the magnetic sheet 530 and the protection sheet 560 in an attachment process of the protection sheet 560 to be described later, and thus they can prevent bubble occurrence on the protection sheet 560. That is, the air accommodation holes 542 serve to perform planarization of the surface of the protection sheet 560 by preventing the bubble occurrence on the protection sheet 560.

It is exemplified that the first step height compensation sheet 540 is one selected among a polyethylene naphthalate (PEN) film, a polyethylene terephthalate (PET) film, a polyimide (PI) film, a polycarbonate (PC) film, and a poly styrene sulfonate (PSS) film.

The second step height compensation sheet 550 is disposed on the concave region 532 of the magnetic sheet 530. In order to form the concave region 532 for preventing interference between the geomagnetic sensor and the magnetic sheet 530, the second step height compensation sheet 550 is formed in the same shape as the shape of the region cut off from the magnetic sheet 530, and it is disposed in the concave region 532. In this case, the second step height compensation sheet 550 may be formed in various shapes, such as a rectangle and a sector, corresponding to the shape of the concave region 532.

It is exemplified that the second step height compensation sheet 550 is one resin material selected among a polyethylene naphthalate (PEN) film, a polyethylene terephthalate (PET) film, a polyimide (PI) film, a polycarbonate (PC) film, and a poly styrene sulfonate (PSS) film.

The protection sheet 560 is attached to the radiation pattern formed on the antenna sheet 510, the antenna sheet 510 for preventing damage of the magnetic sheet 530, and the front side of the magnetic sheet 530.

If an impact is applied to the portable terminal, collision may occur between the antenna module 500 and an internal structure (e.g., battery) of the portable terminal. If the collision occurs between the antenna module 500 and the internal structure, the magnetic sheet 530 may be damaged or the characteristic of the magnetic sheet 530 may be changed to exert an influence on the antenna performance.

According to the third embodiment of the present disclosure, a dummy region is formed on one side portion of the antenna sheet 510 and one side portion of the magnetic sheet 530. In this case, the dummy region may include a first dummy region 518 formed on the antenna sheet 510 and a second dummy region 538 formed on the magnetic sheet 530. Here, the first dummy region 518 is a region formed on one side portion of the antenna sheet 510, and it means a region on which the radiation pattern is not formed among the whole region of the flexible board 511. The second dummy region 538 is a region formed on one side portion of the magnetic sheet 530, and it means a region formed by removing a part of the one side portion of the magnetic board.

The third step height compensation sheet 570 is disposed on one side portion of the magnetic sheet 530, and it is disposed on the second dummy region 538. That is, the third step height compensation sheet 570 absorbs the impact occurring when the magnetic sheet 530 and the internal structure of the portable terminal collide with each other, and thus it prevents the damage and the characteristic change of the magnetic sheet 530.

In this case, it is exemplified that the third step height compensation sheet 570 is one selected among a polyethylene naphthalate (PEN) film, a polyethylene terephthalate (PET) film, a polyimide (PT) film, a polycarbonate (PC) film, and a poly styrene sultanate (PSS) film.

The adhesive sheet 580 is to attach the antenna module 500 to a rear housing of the portable terminal, and it is attached to the antenna sheet 510 and the rear side of the magnetic sheet 530. In this case, the front side of the adhesive sheet 580 is attached to the antenna sheet 510 and the rear side of the magnetic sheet 530. A release film, which is removed before the process of attaching the antenna module 500 to the portable terminal, is attached to the rear side of the adhesive sheet 580. Here, the adhesive sheet 580 may include a first adhesive sheet 580 attached to the antenna sheet 510 and a second adhesive sheet 580 attached to the magnetic sheet 530.

In the portable terminal, a structure for supporting the circuit board (e.g., a support projection connecting the battery and the main circuit board to each other) is formed, and since the size (area) of the antenna module 500 is increased, the antenna module 500 may be disposed in the region in which the structure is formed.

In this case, a hole for penetrating the structure may be formed in the antenna module 500, but if the hole is formed, an area for forming the radiation pattern is decreased or it is not possible to implement the radiation pattern in the form of a loop, resulting in that it is not possible to implement the antenna performance required in the portable terminal.

Figure 27:
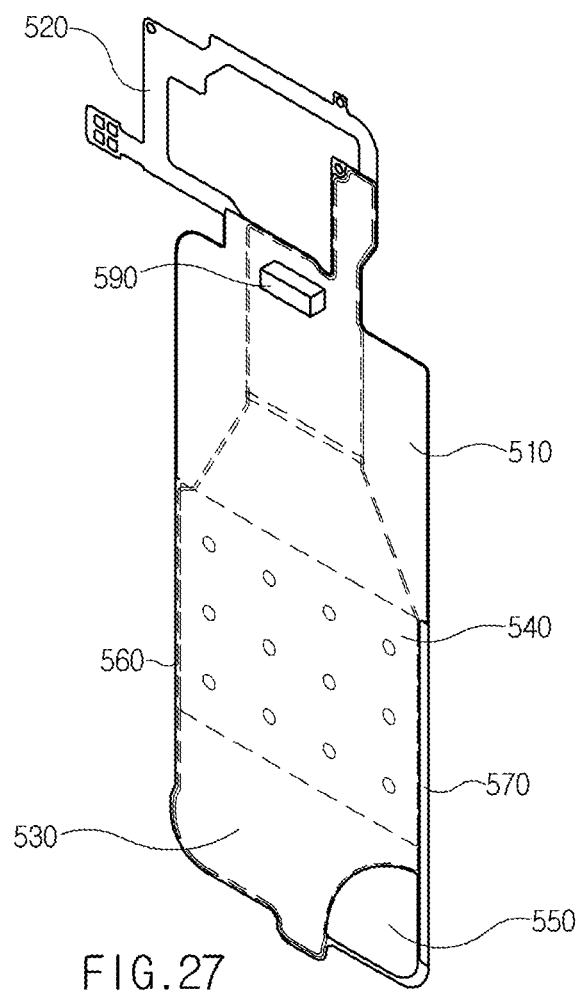
FIGS. 27 to 30 are views explaining modified examples of an antenna module according to a third embodiment of the present disclosure.

Referring to FIG. 27, the antenna module 500 according to the third embodiment of the present disclosure may further include a support member 590 for supporting the circuit board. That is, instead of forming the hole, the support member 590 projecting toward the front side (i.e., direction of the circuit board) is disposed on the antenna module 500.

Through this, the antenna module 500 can firmly support the circuit board while maintaining the antenna performance.

Figure 28:
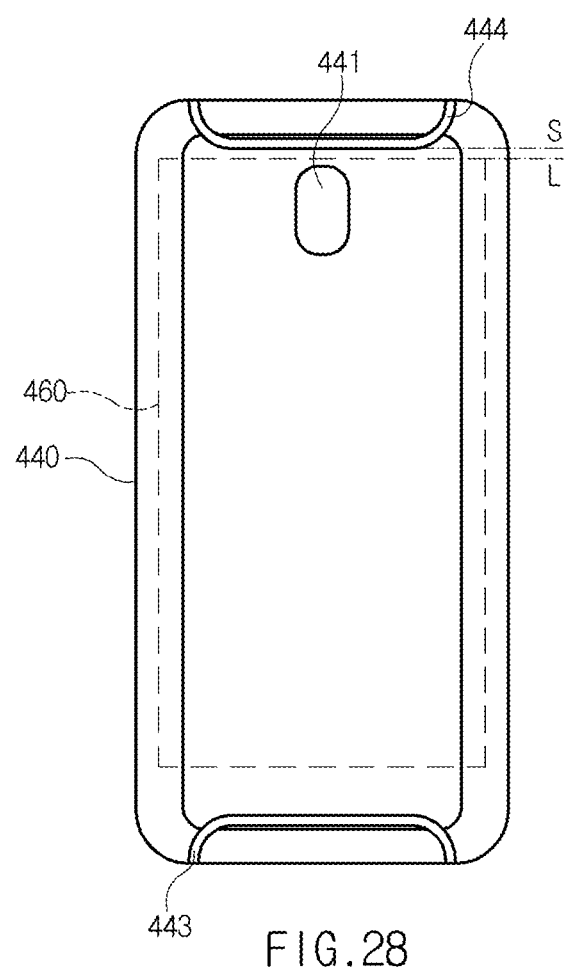

Referring to FIG. 28, the lowermost portion S of the second slit 444 is disposed closer to the antenna sheet 510 in comparison with the uppermost portion L of the display 460. Accordingly, the radiation field formed on the rear side of the portable terminal becomes weaker than the radiation field formed on the front side of the portable terminal. That is, since the magnetic field emitted from the second radiation pattern 513 first passes through a non-metal region on the front side before passing through the second slit 444, the radiation field on the rear side becomes weakened.

Further, the antenna performance may be deteriorated due to the interference between the main antenna of the portable terminal and the radiation pattern of the antenna module 500.

Figure 29:
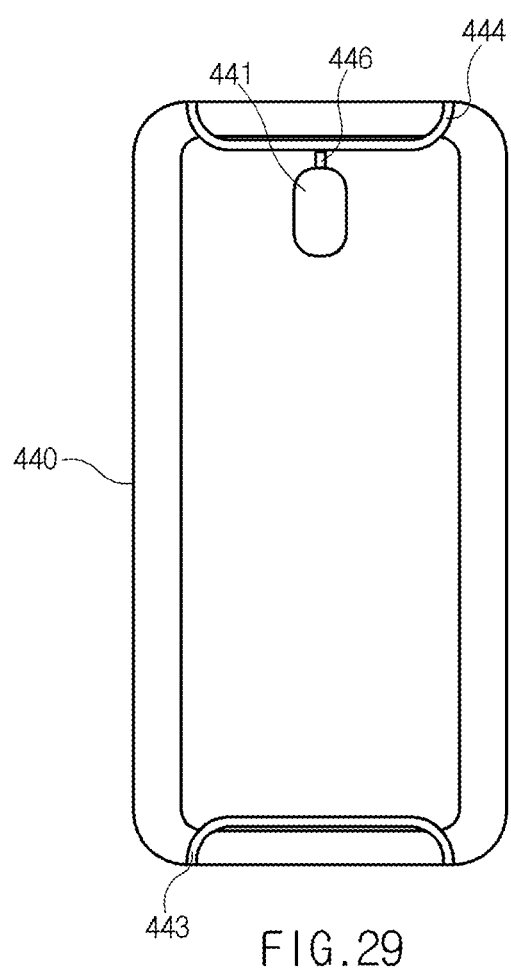

Referring to FIG. 29, on the rear cover 440 of the portable terminal, a third slit 446 in a vertical direction may be formed to connect the second slit 444 and the camera hole 52. That is, by forming the third slit 446 that is disposed closer to the antenna sheet in comparison with the uppermost portion L of the display 460 on the rear cover 440, the radiation field on the rear side is strengthened, and interference between the main antenna and the antenna module 510 is minimized.

Figure 30:
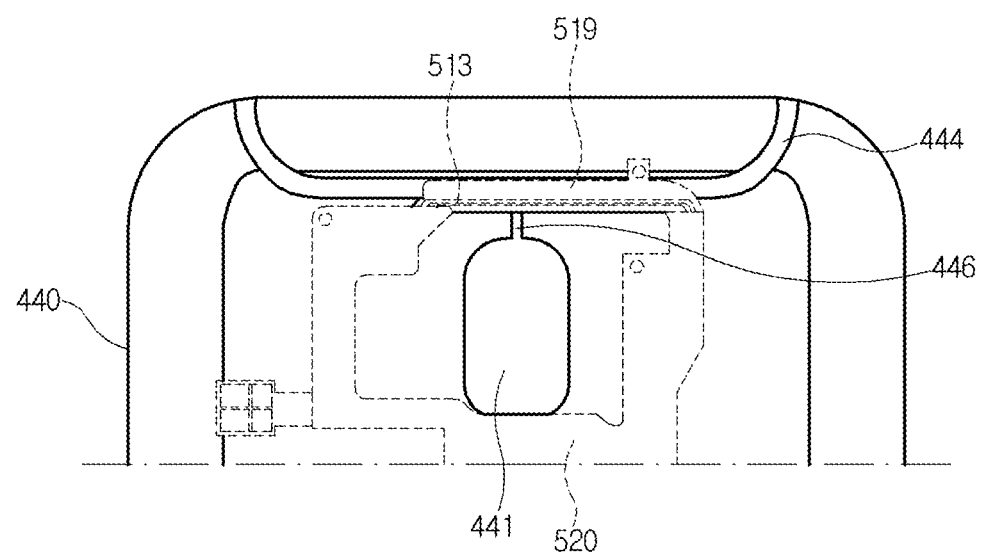

On the other hand, referring to FIG. 30, the antenna sheet 510 may be disposed not to overlap the second radiation pattern 513 on a region that overlaps the second slit 444 in order to prevent the interference occurrence with the main antenna. That is, on the antenna sheet 510, a dummy space 519 in which the second radiation pattern 513 is not formed is disposed on a region of the flexible board 511 that overlaps the second slot 444. Here, in order to configure the number of turns of the second radiation pattern 513, an interval between patterns of the second radiation pattern 513 may be set to be narrow.

A region of the shielding sheet 520 disposed in the direction of the second slit 444 may be removed. That is, the shielding sheet 520 is formed along the outer periphery of the accommodation hole 515, but a partial region adjacent to the second slit 44 is formed in an open structure.

Through this, in the case where a slit 442 in the vertical direction is formed on the portable terminal, the performance of the main antenna of the portable terminal and the antenna module 500 can be prevented from being deteriorated by removing a part of the shielding sheet 520 and forming a dummy region on the antenna sheet 510.

Further, by the above-described configuration of the antenna module 500, the recognition rate for electronic payment and near field communication can be maximized on the front side (i.e., direction of the display module) and the rear side (i.e., direction of the rear cover 52) of the portable terminal. This will be described hereinafter with reference to the accompanying drawings.

FIG. 31 illustrates the results of measuring the electronic payment performance (i.e., recognition rate and recognition range by the first radiation pattern 512) of the antenna module 500 according to the third embodiment of the present disclosure.

Referring to this, according to the third embodiment of the present disclosure, if the rear cover 440 on which the slit 442 is formed is applied to the antenna module 500, it can be seen that the recognition rate and the recognition range satisfy the reference performances in the electronic payment.

In this case, the antenna module (i.e., antenna module 500 illustrated in FIG. 20) 500 applied to the rear cover 440 on which the third slit 446 is not formed has higher recognition rate and recognition range on the front side (i.e., display direction) in comparison with the rear side (i.e., direction of the rear cover 440).

This is because the second slit 444 of the rear cover 440 is disposed in a position that is higher than a non-metal region on the front side of the portable terminal, and thus a stronger radiation field is formed on the front side of the portable terminal.

On the other hand, the antenna module (i.e., antenna module 500 illustrated in FIG. 30) 500 applied to the rear cover 440 on which the third slit 446 is formed has higher recognition rate and recognition range on the rear side in comparison with the front side.

This is because the third slit 446 of the rear cover 440 is disposed in a position that is lower than a non-metal region on the front side of the portable terminal, and thus a stronger radiation field is formed on the rear side of the portable terminal.

FIG. 32 illustrates the results of measuring the near field communication performance (i.e., recognition distance and load modulation by the second radiation pattern 513) of the antenna module 500 according to the third embodiment of the present disclosure.

Referring to this, according to the third embodiment of the present disclosure, if the rear cover 440 on which the slit 442 is formed is applied to the antenna module 500, it can be seen that the recognition distance and the load modulation satisfy the reference performances in the near field communication.

In this case, since the magnetic field generated by the second radiation pattern 513 passes through the third slit 446 to form a radiation field, a loss caused by the rear cover 440 of a metal material is minimized in comparison with the structure that forms the radiation field through the second slit 444.

Through this, it can be seen that the recognition distance and the load modulating performance of the antenna module (i.e., antenna module 500 illustrated in FIG. 30) 500 applied to the rear cover 440 on which the third slit 446 is formed are improved about twice in comparison with those of the antenna module (i.e., antenna module 500 illustrated in FIG. 20) 500 applied to the rear cover 440 on which the third slit 446 is not formed.

Further, in the case of the antenna module (i.e., antenna module 500 illustrated in FIG. 30) 500 applied to the rear cover 440 on which the third slit 446 is formed, the recognition rate during the near field communication is about 57.52%, and thus it satisfies the recognition rate condition (equal to or higher than 55%) required during the near field communication.

In particular, in the case of the antenna module (i.e., antenna module 500 illustrated in FIG. 20) 500 applied to the rear cover 440 on which the third slit 446 is not formed, the recognition rate during the near field communication is about 71.24% that is a recognition rate increased by about 16% in comparison with the recognition rate condition, and thus the near field communication performance is improved.

It will be understood by those skilled in the art that the present disclosure is not limited to the foregoing embodiments but various modifications and changes of the present disclosure may be made without departing from the spirit and scope of the present disclosure.

The invention claimed is:

1. An antenna module comprising:
   a flexible sheet;
   a radiation pattern formed on the flexible sheet; and
   a magnetic sheet disposed on a front side and a rear side of the flexible sheet,
   wherein the flexible sheet is partitioned into a plurality of regions, and
   the radiation pattern is formed on a front side and a rear side of a part of the plurality of regions and the radiation pattern is formed on one of a front side and a rear side of a remaining part of the plurality of regions,
wherein the radiation pattern comprises a first radiation pattern wound on an outer periphery of an insertion hole formed on the flexible sheet and formed on at least one of the front side and the rear side of the flexible sheet,
wherein the flexible sheet comprises:
a first region on an upper portion of the insertion hole, and the first radiation pattern formed on the first region;
a second region on a lower portion of the insertion hole, and the first radiation pattern formed on the second region;
a third region on one side portion of the insertion hole, and the first radiation pattern formed on the third region; and
a fourth region on the other side portion of the insertion hole, and the first radiation pattern formed on the fourth region,
wherein the first radiation pattern is formed on the front and rear sides of the third region and the fourth region, and
wherein the number of turns of the first radiation pattern formed on the third region and the fourth region is smaller than the number of turns of the first radiation pattern formed on the first region and the second region.

2. The antenna module of claim 1, wherein the first radiation pattern is a radiation pattern for electronic payment.

3. The antenna module of claim 1, wherein the first radiation pattern is formed on one of the front side and the rear side of the first region, and the first radiation pattern is formed on the other of the front side and the rear side of the second region.

4. The antenna module of claim 1, wherein the first radiation pattern is formed on the front side of the first region, and the magnetic sheet is formed on the rear side of the second region.

5. The antenna module of claim 4, wherein the magnetic sheet is disposed on the front side of the second region, and the first radiation pattern is formed on the rear side of the second region.

6. The antenna module of claim 1, wherein the linewidth of the first radiation pattern formed on the third region and the fourth region is wider than the linewidth of the first radiation pattern formed on the first region and the second region.

7. The antenna module of claim 1, further comprising a second radiation pattern wound on an outer periphery of an accommodation hole formed spaced apart from the insertion hole on the flexible sheet and formed on at least one of the front side and the rear side of the flexible sheet.

8. The antenna module of claim 7, wherein the second radiation pattern is a radiation pattern for near field communication.

* * * * *